United States Patent
Beroz

(10) Patent No.: US 6,461,892 B2
(45) Date of Patent: Oct. 8, 2002

(54) METHODS OF MAKING A CONNECTION COMPONENT USING A REMOVABLE LAYER

(75) Inventor: Masud Beroz, Livermore, CA (US)

(73) Assignee: Tessera, Inc., San Jose, CA (US)

( * ) Notice: Subject to any disclaimer, the term of this patent is extended or adjusted under 35 U.S.C. 154(b) by 39 days.

(21) Appl. No.: 09/757,968

(22) Filed: Jan. 10, 2001

(65) Prior Publication Data

US 2002/0031905 A1 Mar. 14, 2002

Related U.S. Application Data

(60) Provisional application No. 60/178,146, filed on Jan. 26, 2000.

(51) Int. Cl.$^7$ .......................... H01L 21/20; H01L 21/44
(52) U.S. Cl. ........................................ 438/106; 438/737
(58) Field of Search ................... 438/689, 737, 438/106

(56) References Cited

U.S. PATENT DOCUMENTS

| | | | |
|---|---|---|---|
| 5,518,964 A | 5/1996 | DiStefano et al. | 437/209 |
| 5,590,460 A | 1/1997 | DiStefano et al. | 29/830 |
| 5,763,941 A | 6/1998 | Fjelstad | 257/669 |
| 5,801,441 A | 9/1998 | DiStefano et al. | 257/696 |
| 5,989,936 A | 11/1999 | Smith et al. | 438/106 |
| 6,117,694 A | 9/2000 | Smith et al. | 438/14 |

*Primary Examiner*—Vu A. Le
*Assistant Examiner*—Beth E. Owens
(74) *Attorney, Agent, or Firm*—Lerner, David, Littenberg, Krumholz & Mentlik, LLP

(57) ABSTRACT

A method of making a connection component includes providing a removable layer having first and second surfaces and forming vias at spaced apart first locations of the removable layer. A conductive material, such as copper, is deposited over the first surface of the removable layer and in each of the vias to form one or more flexible leads including projections which extend downwardly in the vias toward the removable layer. Each lead includes a first end integrally connected with one of the projections and a second end remote from the first end. A substrate is provided over the conductive material. The removable layer is removed so that the first and second ends of the leads are movable away from one another. As a result, at least first or second ends of the leads are connected to the substrate without using a bonding or welding step.

82 Claims, 22 Drawing Sheets

METHODS OF MAKING A CONNECTION COMPONENT USING A REMOVABLE LAYER

CROSS-REFERENCE TO RELATED APPLICATIONS

The present application claims benefit of U.S. Application No. 60/178,146 filed Jan. 26, 2000, the disclosure of which is hereby incorporated by referenced herein.

BACKGROUND OF THE INVENTION

The present invention relates to microelectronic packaging and more particularly relates to methods of making connectors and packaged microelectronic components. In various microelectronic devices, it is desirable to provide a connection between two components, which can accommodate relative movement between the components. For example, where a semiconductor chip is mounted to a circuit board, thermal expansion and contraction of the chip and circuit board can cause the contacts on the chip to move relative to the corresponding electrically conductive features of the circuit board. This can occur during service and can also occur during manufacturing operations as, for example, during soldering operations on the circuit board.

As illustrated in certain preferred embodiments of commonly assigned U.S. Pat. No. 5,518,964 ("the '964 patent"), the disclosure of which is incorporated herein by reference, movable interconnections between elements such as a semiconductor chip and a substrate can be provided by first connecting leads between the elements and then moving the chip and the substrate away from one another through a predetermined displacement so as to bend the leads. For example, the substrate may be a connection component including a dielectric body and leads extending along a bottom surface of the dielectric body. The leads may have first or fixed ends permanently attached to the dielectric element and connected to electrically conductive features such as terminals, traces or the like on the dielectric body. The leads may also have second or releasable ends releasably attached to the dielectric body. The dielectric body, with the leads thereon, may be juxtaposed with the chip and the second ends of the leads may be bonded to contacts on the chip. Following bonding, the dielectric body and chip are moved away from one another, thereby bending the leads towards a vertically extensive disposition. During or after movement, a curable material such as a liquid composition may be introduced between the elements. The curable material is then cured such as by using heat, to form a compliant dielectric layer such as an elastomer or gel surrounding the leads. The resulting packaged semiconductor chip has terminals on the dielectric body or connection component which are electrically connected to the contacts on the chip but which can move relative to the chip so as to compensate for thermal effects. For example, the packaged chip may be mounted to a circuit board by solder-bonding the terminals to conductive features on the circuit board. Relative movement between the circuit board and the chip due to thermal effects is taken up in the moveable interconnection provided by the leads and the compliant layer.

Numerous variations of these processes and structures are disclosed in the '964 patent. For example, the package-forming process can be conducted on a wafer scale, so that the numerous semiconductor chips in a unitary wafer are connected to connection components in one sequence of operations. The resulting packaged wafer is then severed so as to provide individual units, each including one or more of the chips and portions of the dielectric body associated therewith. Also, the leads may be formed on the chip or wafer rather than on the dielectric body. In further embodiments, also disclosed in the '964 patent, a connector for use in making connections between two other microelectronic elements is fabricated by a generally similar process. For example, in one embodiment a dielectric body having terminals and leads as discussed above is connected to terminal structures on a temporary sheet. The temporary sheet and dielectric body are moved away from one another so as to bend the leads, and a liquid material is introduced around the leads and cured so as to form a compliant layer between the temporary sheet and the dielectric body. The temporary sheet is then removed, leaving the tip ends of the terminal structures projecting from a surface of the compliant layer. Such a component may be used, for example, by engaging it between two other components. For example, the terminal structures may be engaged with a semiconductor chip, whereas the terminals on the dielectric body may be engaged with a circuit panel or other microelectronic component.

Commonly assigned U.S. Pat. No. 6,117,694, the disclosure of which is incorporated herein by reference, teaches a microelectronic component, such as a connector or a packaged semiconductor device that is made by connecting multiple leads between a pair of elements and moving the elements away from one another so as to bend the leads toward a vertically extensive disposition. One of the elements includes a temporary support which is removed after the bending operation and after injecting and curing a dielectric material to form a dielectric layer surrounding and supporting the leads.

Despite the teachings of the '964 patent, the '649 patent, and the other advances in the art, there are still needs for further improvements in connection components and methods for making such connection components. Specifically, there is a need for a connection component whereby the flexible leads may be made without having to bond the lead and a method of making expandable, flexible linkages by using plating processes rather than joining processes.

SUMMARY OF THE INVENTION

One aspect of the present invention provides methods of making a component, such as a compliant connection component, having one or more leads. The leads may be flexible. One preferred method includes providing a removable or sacrificial layer having first and second surfaces and vias at spaced apart first locations of the removable layer. The vias may be formed using a broad array of processes including chemical etching processes and punching holes therein. The vias preferably extend from the first surface toward the second surface of the removable layer. The vias may be what are commonly referred to as "through vias" that extend from the first surface to the second surface of the removable layer. The vias may also be blind or partial vias that extend only part of the way between the first and second surfaces of the removable layer.

A conductive material, such as metal, may be deposited over the first surface of the removable layer and in each via to form one or more leads, each lead including a first end and a second end at a location remote from the first end of the lead. In certain embodiments, before the conductive material is deposited over the removable layer, the removable layer is placed atop the first surface of a substrate so that the first ends of the leads are connected to the substrate during the depositing a conductive material step. The conductive material deposited in the vias of the removable layer forms projections at the first ends of the leads extending downwardly into the removable layer. The projections are preferably connected with the substrate as they are formed. As a result, a separate bonding step is not required for reliably connecting the leads to the conductive metal sheet. This simplifies the process for making a connection component.

A dielectric layer may then be provided over the conductive material, such as by depositing the dielectric material over the conductive material. The removable layer may then be removed. After the removable material has been removed, the first and second ends of the flexible leads are preferably movable away from one another. For example, the second ends of the leads may be permanently attached to the dielectric layer while the first ends of the leads may be releasable and/or peelable from the dielectric layer. In preferred embodiments, a substrate, such as a conductive metal sheet including copper, is juxtaposed with the removable layer before the conductive material is deposited over the removable layer.

One preferred method of making a connection component having one or more flexible leads includes the steps of providing a removable layer having a first surface and a second surface and forming one or more vias at spaced apart first locations, the vias extending from the first surface toward the second surface of the removable layer. In certain embodiments the vias include through vias that extend from the first surface to the second surface of the removable layer. In other embodiments the vias may be blind vias that extend only partially from the first surface toward the second surface of the removable layer. The removable layer includes a soluble material. In certain preferred embodiments the removable layer includes a metal such as aluminum that may be removed, such as by using an etching solution. In other preferred embodiments the removable layer includes a soluble material such as a polymer. The removable or sacrificial layer may be removed by chemical etching, melting the removable layer, burning the removable layer or dissolving the removable layer.

After the vias have been formed at spaced apart first locations, a conductive material, such as copper, is preferably deposited over the first surface of the removable layer and in each via so as to form one or more leads atop the removable layer and to form projections in the vias extending downwardly into the removable layer. The leads formed by deposition of the conductive material preferably include first ends integrally connected with the projections at the first locations and second ends at locations remote from the first ends. In certain preferred embodiments the conductive material is deposited in the vias simultaneously with deposition of the conductive material over the first surface of the removable layer. However, in other preferred embodiments, the deposition of the conductive material over the first surface of the removable layer is not conducted simultaneously with the deposition of the conductive material in each via. For example, the conductive material may be deposited in each via from the second surface of the removable layer. The projections at the first ends of the leads and are generally hollow. In preferred embodiments, the hollow portions of the projections may be generally cup-shaped. In other preferred embodiments the projections are rivet shaped and have lower ends projecting away from the via at the second surface of the removable layer.

The conductive material may be deposited over the removable layer by methods such as electroplating the conductive material on the removable layer; electrolessly plating the conductive material on the first surface of the removable layer; chemical vapor deposition; or combinations of these methods as, for example, by first depositing a seed layer, such as chromium, over the removable layer and in the vias formed therein, and then plating or sputtering a conductive material over the seed layer.

After the conductive material has been deposited over the removable layer and in the vias to form leads, a dielectric layer is preferably provided over the conductive material. In certain embodiments, the first ends of the leads are releasable from the dielectric layer and the second ends are permanently secured to the dielectric layer. The first ends of the leads may be coated with an adhesion-reducing substance for reducing adhesion between the dielectric layer and the first ends. The leads may also be formed as set forth in commonly assigned U.S. Pat. No. 5,763,941, the disclosure of which is incorporated herein by reference, with one end of the lead permanently fastened to the dielectric layer and the other end of the lead releasably bonded to the dielectric layer, whereby the releasable end is held in place by a bond having relatively low peel strength. As a result, the first ends of the flexible leads are preferably releasably secured to the dielectric layer and the second ends of the flexible leads are permanently secured thereto.

The method of forming a compliant connection component may also include the step of forming one or more vias in the dielectric layer. The one or more vias preferably extend toward the removable layer to expose the second ends of the flexible leads. A conductive material is then preferably deposited in the vias of the dielectric layer so as to form second conductive terminals integrally connected to the second ends of the leads. The second conductive terminals are preferably electrically connected to the second ends of the leads. The second conductive terminals extend in generally vertical directions away from the removable layer. The second terminals are preferably substantially hollow and may include generally cup-shaped structures having openings that face away from the removable layer. The vias may be formed in the dielectric layer by using a laser drilling step, an etching process, other hole forming steps or a combination of the above. The vias preferably extend completely through the dielectric layer. The conductive material deposited atop the dielectric layer preferably includes a conductive metal such as copper, but may include any other material that is substantially conductive.

After the leads and the dielectric layer have been formed, the removable layer is preferably removed so that the first and second ends of the leads are movable away from one another. The removable layer preferably includes a material, such as aluminum or a polymer, that may be removed by exposure to a solvent, thereby leaving the bottom surface of the dielectric layer exposed and the leads free to bend away from the dielectric layer. In this condition, the dielectric layer supports the leads; the leads having first ends with projections integrally connected thereto projecting away from the bottom surface of the dielectric layer.

After the removable layer has been removed, the connection component may be juxtaposed with a substrate, such as a microelectronic element having contacts thereon so that the projections at the first ends of the leads may be connected with the contacts of the microelectronic element. The microelectronic element and the dielectric layer may then be moved relative to one another with a component of motion in a generally vertical direction so as to move the microelectronic element and the dielectric layer away from one another for deforming or bending the leads to a vertically-extensive disposition. The leads are preferably flexible. Restraining straps may be connected to the dielectric layer and the substrate for limiting movement of the dielectric layer and the substrate away from one another. The restraining straps are preferably thicker and shorter than the leads. The moving step may include the step of peeling the first ends of the flexible leads away from the dielectric layer. In certain preferred embodiments, an electrically conductive bonding material is applied to the bottom of the projections for facilitating formation of a bond and electrical connection between the contacts and the projections of the flexible leads. The conductive bonding material may be a solder, a diffusion bonding alloy, a eutectic bonding material or a conducive polymer, and may be provided with a thin layer of gold to inhibit oxidation.

During or after movement of the substrate and the dielectric layer away from one another, a first encapsulant, such as a compliant layer, may be provided between the dielectric layer and the substrate. The first encapsulant may be provided by introducing a curable liquid between the dielectric layer and the substrate and around the leads. After the curable liquid has been injected, the assembly is exposed to a curing process for curing the curable liquid so as to provide a compliant layer between the dielectric layer and the substrate. The compliant layer preferably allows the leads to flex and bend during use of the connection component of the present invention. The first encapsulant may be either rigid or compliant.

A second encapsulant, such as a curable liquid, is then disposed between the dielectric layer and the substrate and the leads. The second encapsulant may also be either rigid or compliant. The steps of encapsulating the leads with a first encapsulant and disposing the second encapsulant between the dielectric layer and the substrate may occur simultaneously. The first and second encapsulants may comprise a common material or may be a different material. The first and second encapsulants may include silicones, silicone elastomers, silicone gels, flexibilized epoxies and epoxies.

After the connection component of the present invention is connected to a chip or other microelectronic element by electrically connecting the first ends of the leads to such chip or microelectronic element, the second conductive terminals at the second ends of the leads can be electrically connected to the contacts on another microelectronic element, such as a printed circuit board or other substrate. The first and second ends of the leads are preferably movable with respect to one another. The movability of the leads and terminals connected thereto will provide compensation for phenomena such coefficient of thermal expansion differences.

In other preferred embodiments, a substrate, such as a metallic sheet including copper may be juxtaposed with the first ends of the leads. The metallic sheet may be engaged with the projections at the first ends of the leads after removal of the removable layer. Alternatively, the metallic sheet may be juxtaposed with the second surface of the removable layer and the projections at the first ends of the flexible leads may be electrically connected to or bonded to the metallic sheet. The metallic sheet may be juxtaposed with the removable layer before or after conductive metal is deposited over the removable layer. Preferably, the metallic sheet is electrically connected with the projections at the first ends of the flexible leads by fusing the projections with the metallic sheet.

After the removable layer is removed as set forth above, the metallic sheet and the dielectric layer may then be moved relative to one another with a component of motion in a substantially vertical direction so as to move the metallic sheet and the dielectric layer away from one another and to bend the flexible leads into a generally vertically extensive disposition. An encapsulant layer may be provided between the dielectric layer and a metallic sheet such as by introducing a curable liquid encapsulant between the dielectric layer and the metallic sheet and around the flexible leads. The encapsulant may be introduced during or after movement of the dielectric layer and the metallic sheet. The complaint layer may then be cured for providing a resilient layer between the dielectric layer and the metallic sheet and around the leads. Portions of the metallic sheet may then be removed to leave residual portions of the metallic sheet forming first conductive terminals electrically connected to the first ends of the leads. The portions of the metallic sheet may be removed either before or after the dielectric layer and the substrate are moved away from one another. This may be accomplished by depositing spots of an etch resistant substance, such as solder, over the bottom surface of the metallic sheet, as disclosed in commonly assigned U.S. patent application Ser. No. 08/989,312, the disclosure of which is incorporated herein by reference. The copper sheet may then be exposed to an etching solution for removing the portions of the copper sheet not covered by the solder mask.

Selectively etching away the copper sheet except for the portion of the sheet underlying the solder mask forms one or more conductive terminals electrically connected with the projections at the first ends of the leads. The terminals may then be electrically connected to the contacts of a first microelectronic element. The microelectronic element may include a circuit board, a wafer, a flexible circuit, a dielectric layer, a test socket, one or more packaged semiconductor chips, or one or more bare semiconductor chips. The first microelectronic element may then be moved away from the dielectric layer in a generally vertical direction so that the flexible leads are deformed to a vertically extensive disposition. A compliant layer may be formed between the dielectric layer and the first microelectronic element as described above.

In certain preferred embodiments the first microelectronic element may include a wafer having a plurality of semiconductor chips, whereby after the compliant layer has been formed between the wafer and the dielectric layer, the wafer is severed to provide individual units, each unit including one or more of the semiconductor chips with terminals and leads connected to the one or more chips.

In further preferred embodiments, methods of making the connection component may include the step of providing two or more removable layers and one or more dielectric layers for fabricating a multi-layer structure having two or more layers of flexible leads. The connection component of the present invention can also be connected to another connection component of the present invention.

As mentioned above, certain embodiments of the present invention may include restraining straps having one end connected to a dielectric layer and an opposite end connected to a substrate, such as a conductive metal sheet or microelectronic element. The restraining straps are generally shorter and thicker than the leads for limiting movement of the dielectric layer and the substrate/microelectronic element away from one another. The restraining straps may comprise the same material as the leads, such as copper, and may be formed simultaneously with the leads during the depositing a conductive metal step described above.

These and other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 10C-2 shows a fragmentary bottom view of the subassembly shown in FIG. 10C-1.

DETAILED DESCRIPTION OF PREFERRED EMBODIMENTS

Figure 1A:
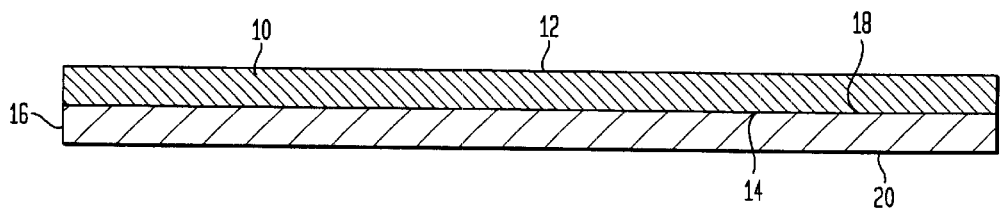
FIGS. 1A–1L show a method of making a compliant connection component having flexible leads in accordance with an embodiment of the present invention.

A method of making a compliant connection component according to one embodiment of the present invention is shown in FIGS. 1A–1L. Referring to FIG. 1A, the method includes providing a removable or sacrificial layer 10 having a first surface 12 and a second surface 14 remote therefrom. The removable layer 10 preferably includes a material that may be selectively removed or etched away. The removable layer preferably includes an isotropic material, such as aluminum, having a very predictable coefficient of thermal expansion and contraction. Other materials that may be used for the removable layer include polymer materials. The removable layer 10 is preferably provided over a supporting substrate 16 having a first surface 18 and a second surface 20 remote therefrom. The supporting substrate 16 includes a sheet or layer of a conductive material such as copper. The removable layer 10 is provided over the copper layer 16 so that the second surface 14 of the removable layer 10 is in contact with the first surface 18 of the copper layer 16.

Figure 1B:
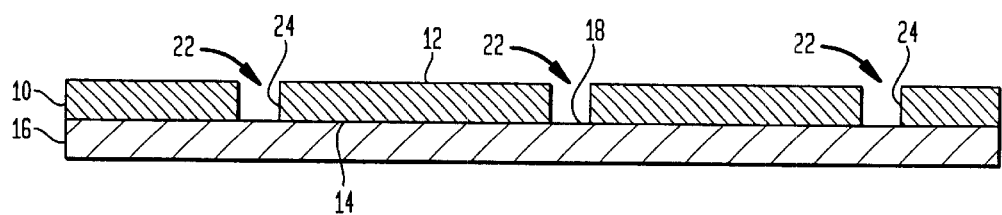

Referring to FIG. 1B, vias 22 having sidewalls 24 are then formed in the removable layer 10. The vias 22 are preferably formed at spaced apart first locations of the removable layer 10 and extend from the first surface 12 to the second surface 14 of the removable layer 10. In the embodiment shown in FIG. 1B, the vias 22 are through vias that extend completely through the removable layer 10 from the first surface 12 to the second surface 14 thereof, so the first surface 18 of the copper layer 16 is exposed in each via 22. The vias 22 are desirably formed by selectively masking the first surface 12 of the removable layer 10 and then chemically etching the removable layer 10. The vias 22 may also be formed by laser ablating the removable layer 10. The vias 22 may also be punched through the removable layer 10 without using a chemical process. In certain preferred embodiments, the removable layer 10 may have preformed vias 22.

Figure 1C:
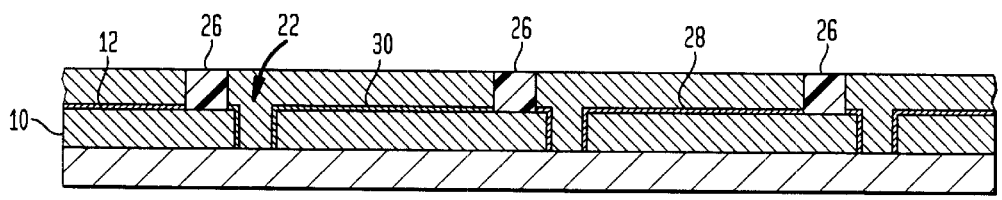

Referring to FIG. 1C, after the through vias 22 are formed in the spaced apart first locations of the removable layer 10, selected portions of the first surface 12 of the removable layer 10 are then masked using a resist 26 leaving openings 27 in regions where leads are to be formed. The openings encompass vias 22. The first surface 12 of the removable layer 10 in openings 27 and the side walls 24 of the through vias 22 are then electrolessly plated with a seed layer 28, such as chromium. The seed layer 28 facilitates the deposition or plating of a conductive metal atop the removable layer 10 and in the through vias 22. Other preferred seed layers are copper, monel and chromium.

Figure 1D:
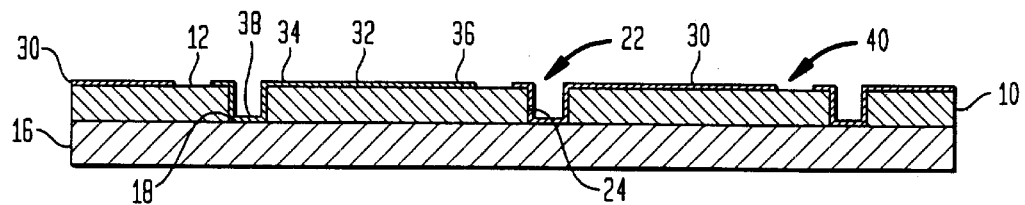

Referring to FIG. 1D, a conductive metal 30 is then selectively deposited in openings 27 atop the seed layer 28 (FIG. 1C) for forming one or more leads 32. The leads 32 are preferably flexible. The conductive metal layer is preferably copper, but may alternatively be gold or another metal compatible with the other materials used in the lead forming processes. The conductive metal 30 may be applied by plating, sputtering, chemical vapor deposition or combinations of these methods. The conductive metal forms flexible leads 32 having first ends 34 and second ends 36 remote therefrom. Each flexible lead 32 overlies the first surface 12 of the removable layer and has a first end 34 adjacent a through via 22 and a second end 36 remote therefrom. Each flexible lead also includes the conductive metal deposited in the through vias 22, which forms projections 38 integrally connected to the first ends 34 of the leads 32. The projections 38 extend toward the copper layer 16 and are generally cup-shaped, the shape being defined by the first surface 18 of the copper sheet 16 and the side walls 24 of the through via 22. After the conductive metal 30 has been plated onto the removable layer 10 for forming the flexible leads 32, the resist 26 (FIG. 1C) is removed. The presence of the resist over selected portions of the removable layer during the deposition of the conductive metal results in the formation of gaps 40 in the deposited conductive metal. The gaps 40 electrically isolate the flexible leads 32 from one another. In other preferred embodiments, the flexible leads 32 may be formed and electrically isolated from one another by completely covering the first surface 12 of the removable layer 10 with a conductive metal and then selectively etching away portions of the deposited conductive metal, leaving the flexible leads and gaps between adjacent leads.

Figure 2:
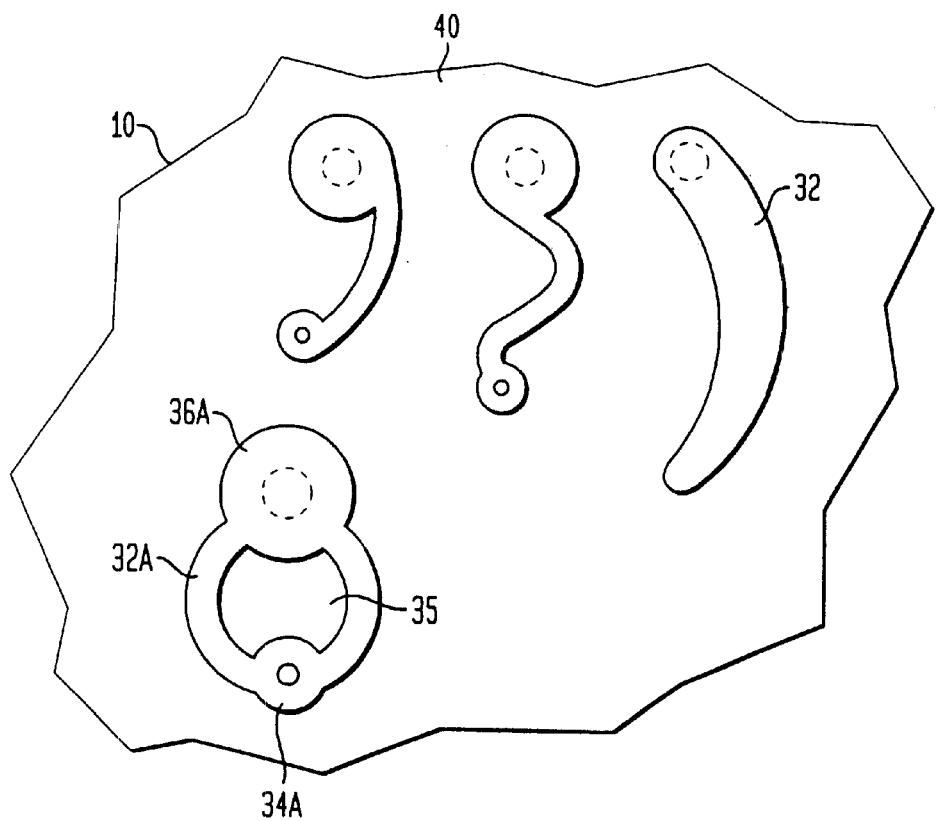
FIG. 2 shows various embodiments of the flexible leads shown in FIG 1I.

The flexible leads 32 may have various configurations such as those shown in FIG. 2 and disclosed in the '964 patent, as well as in commonly assigned U.S. Pat. Nos. 5,927,601 and 6,191,368, the disclosures of which are hereby incorporated by reference herein. The gaps 40 surrounding the flexible leads 32 may have correspondingly varied shapes. In each case, the gaps 40 extend alongside the flexible leads. Lead 32A is in the form of a closed loop connecting the second end 36A of the flexible lead with the first end 34A thereof. The closed loop section of the lead 32A encircles a region 35 of the removable layer 10.

Figure 1E:
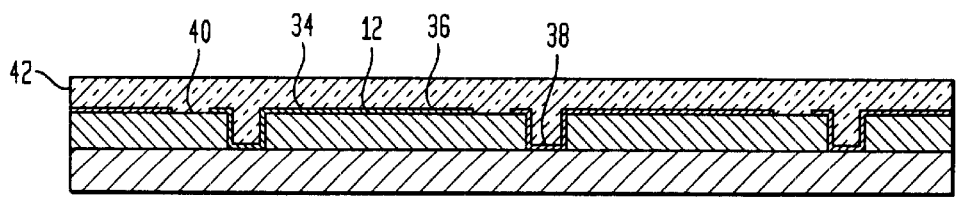

Referring to FIG. 1E, a dielectric layer 42, such as a polyamide material, is then provided over the first surface 12 of the removable layer 10 and the flexible leads 32. The dielectric layer desirably extends into the hollow portion of the cup-shaped projections 38 and into the gaps 40 between the flexible leads 32. The dielectric layer 42 is preferably formed by coating the flexible leads 32 and the removable layer 10 with a polyamide precursor and curing the precursor to form a polyamide layer. In other embodiments, the dielectric layer 42 may be formed by coating the flexible leads 32 and the removable layer 10 with a dielectric material using an electrophoretic process, such as the process disclosed in commonly assigned U.S. Pat. No. 5,590,460, the disclosure of which is hereby incorporated by reference herein. In either case, after the leads have been formed, a conformal coating of a dielectric material is applied over the removable layer. The conformal coating covers the removable layer 10, the leads 32 and the cup-shaped projections 38 at the first ends 34 of the leads. The coating desirably has a substantially uniform thickness and is preferably between about 10 $\mu$m and about 50 $\mu$m thick. In the electrophoretic deposition process, removable layer 10 is electrically connected to a potential source (not shown) and immersed with a counter-electrode in a bath of liquid electrophoretic deposition mixture. The potential applied by the potential source deposits solid material from the electrophoretic deposition mixture. Preferred electrophoretic deposition mixtures include materials supplied under the designation Powercron cationic acrylic (700–900 series), or Powercron cationic epoxy (400–600) by the PPG Company. Preferably, the removable layer 10 and the counterelectrode (not shown) extend horizontally in a bath, and are uniformly spaced apart from one another, typically about 2 cm. apart. After the electrophoretic deposition process, the coated subassembly is removed from the bath, washed to remove clinging undeposited solution and then baked to cure the deposited coating.

Referring to FIG. 1E, the first ends 34 of the leads are preferably peeled away from the dielectric layer during an assembly process that will be described in more detail below. Adhesion between the dielectric layer 42 and the first ends of the flexible leads 32 may be reduced by using the methods disclosed in commonly assigned U.S. patent application Ser. Nos. 09/020,750 and 09/225,669, now abandoned; and U.S. Pat. Nos. 6,357,112 and 6,361,959, the disclosures of which are hereby incorporated by reference herein. For example, prior to forming the dielectric layer 42, an adhesion reducing substance, such as silicone, may be provided over the flexible leads 32 for reducing the level of adhesion between the dielectric layer 42 and the flexible leads. In further preferred embodiments, the adhesion reducing substance may be provided over only the first ends 34 of the flexible leads 32 so that the first ends have less adhesion to the dielectric layer than the second ends 36. In this embodiment, the first ends 34 are commonly referred to as being releasable and the second ends 36 are commonly referred to as being fixed. However, in many instances there is no need to take active steps to enhance peelability between the dielectric layer and the leads because where a polymer is deposited directly over flexible leads, relatively poor adhesion generally results between the leads and the polymer.

Figure 1F:
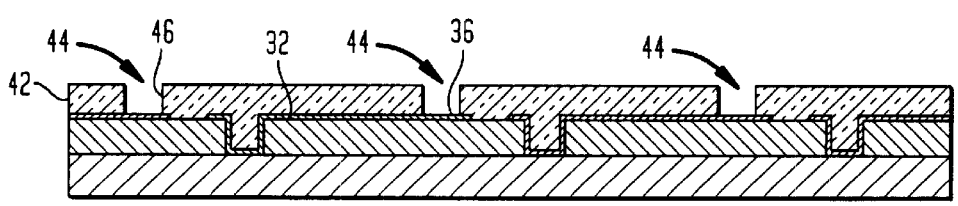
Figure 1G:
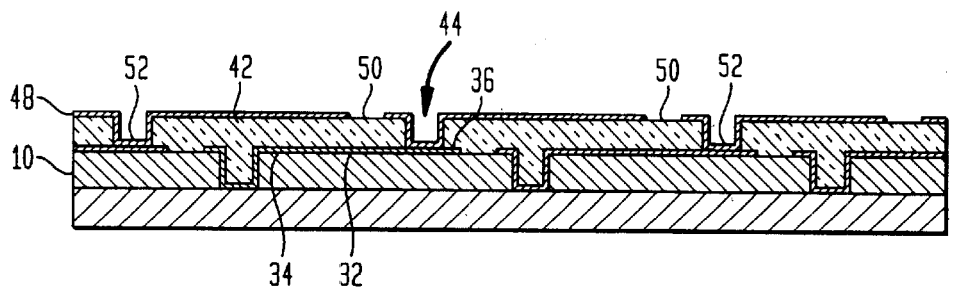

Referring to FIG. 1F, vias 44 having sidewalls 46 are then formed in the dielectric layer 42. The vias 44 preferably extend entirely through the dielectric layer so that the second ends 36 of the flexible leads 32 are exposed through the vias and are accessible from the top surface of the dielectric layer. The vias 44 are preferably formed by laser ablation, drilling, punching or etching the dielectric layer 42. Referring to FIG. 1G, a conductive metal 48, such as copper, is then provided over the dielectric layer 42 and in the vias 44 formed therein. The conductive metal layer 46 is preferably formed using the deposition techniques described above for forming the flexible leads. A resist or mask (not shown) is preferably used to form gaps 50 in the conductive metal layer 48 so that the flexible leads 32 are electrically isolated from one another. The conductive metal in the vias 44 form square conformal liners that provide terminals 52 integrally connected to the second ends 36 of the flexible leads 32. Terminals 52 permanently anchor the second ends 36 of the flexible leads to the dielectric layer.

Figure 3:
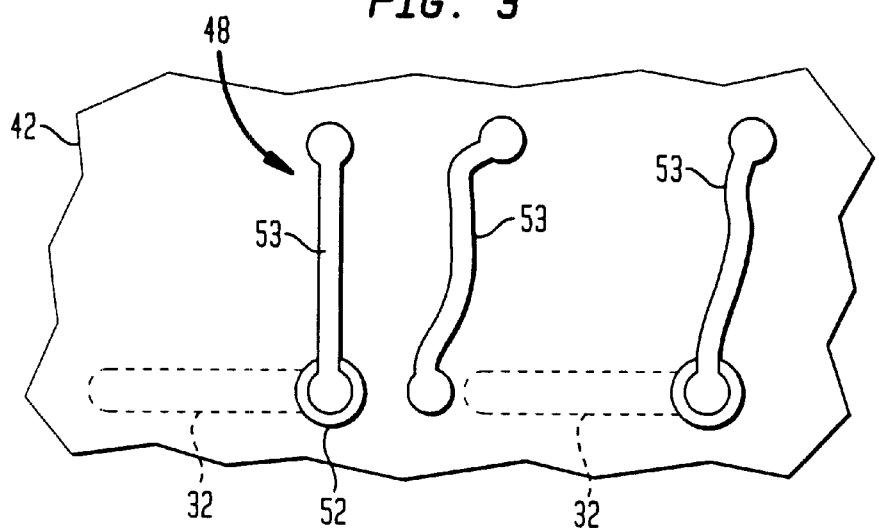
FIG. 3 shows the flexible leads of FIG. 1I interconnected with conductive traces in accordance with further preferred embodiment of the present invention.

Referring to FIG. 3, conductive traces 53 may also be formed in the conductive metal layer 48. At least some of the conductive traces 53 may be connected to some of the terminals 52. Other conductive traces 53 may be provided for carrying a signal from one region of the dielectric layer 42 to another region thereof. The particular conductive traces 53 generally extend in directions substantially perpendicular to the lengthwise direction of the flexible leads 32, but other traces may extend in other directions. Additional conductive features such as ground planes and power planes (not shown) may be provided. Also, the dielectric layer may be provided with plural layers of conductive features such as plural layers of traces.

Figure 1H:
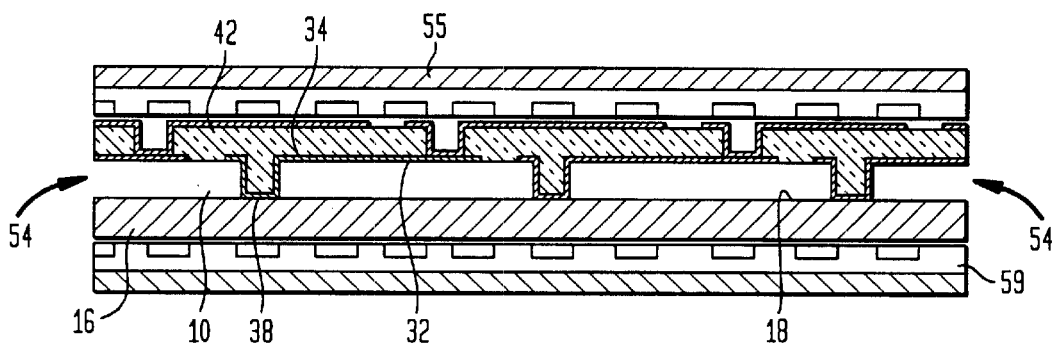

Referring to FIG. 1H, the connection component subassembly is then exposed to an etching solution, such as by immersing the subassembly in the etching solution, for removing the removable layer 10 (FIG. 1G) between the dielectric layer 42 and the copper sheet 16. After the removable layer has been removed, a gap 54 is present between the top surface 18 of the copper layer 16 and the dielectric layer 42. As a result, the flexible leads 32 are no longer constrained from movement by the removable layer and the first ends 34 of the leads 32 including the projections 38 integrally connected thereto may be peeled away from the dielectric layer 42.

Figure 1I:
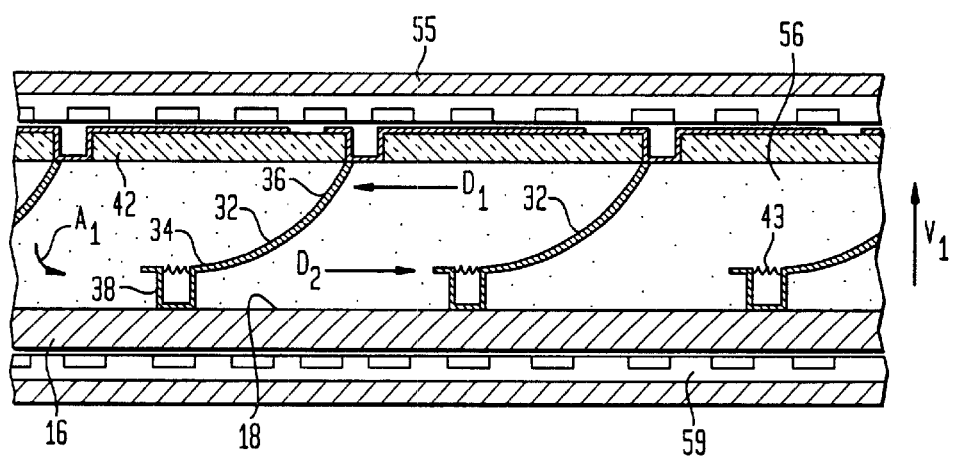

Referring to FIGS. 1H and 1I, the dielectric layer 42 and the copper layer 16 are moved away from one another through a controlled displacement using platens 55, 59 as disclosed in commonly assigned U.S. Pat. No. 5,801,441, the disclosure of which is hereby incorporated by reference herein. A vacuum is preferably applied through platen 55 for firmly holding dielectric layer 42 and through platen 59 for firmly holding conductive sheet 16. Referring to FIG. 1I, the platens are then moved relative to one another by moving one or both of the platens so that platen 55 and hence dielectric layer 42 moves vertically away from platen 59 and conductive sheet 16, in the direction indicated by arrow V1. At the same time, platen 55 and dielectric layer 42 may be moved horizontally relative to platen 59 and conductive sheet 16 in a horizontal direction indicated D1. Stated another way, the horizontal component of motion of the conductive sheet 16 is in a second direction D2, opposite the first horizontal direction D1. Thus, the conductive sheet 16 and the first ends 34 of the leads 32 follow an arcuate path A1 relative to the dielectric layer 42 and the second ends 36 of the leads 32. The vertical movement typically is about 100–500 microns, and the horizontal movement is approximately equal to the vertical movement. During controlled movement, the first ends of the leads including the cup-shaped projections break away from the dielectric layer, whereby portions of the dielectric material in the form of bumps 43 remain in the cup-shaped projection. The second ends 36 of the leads 32 (welded to the terminals 52) remain fixed to the dielectric layer 42. With continued movement of the dielectric layer 42 and the copper layer 16 away from one another, the leads 32 deform and/or bend in a vertical direction away from the dielectric sheet and the second ends thereof.

The net effect of the relative movement of the dielectric layer 42 and the copper layer 16 is to move the first ends 34 of the leads 32 horizontally towards and vertically away from the second ends 36 of the same leads, thus forming each lead 32 into a vertically extensive, curved structure as illustrated in FIG. 1I. In embodiments having the leads curved in a horizontal direction along the dielectric layer 42, as shown in FIG. 2, the movement step need not include a horizontal displacement of the dielectric layer 42 relative to the conductive sheet 16. Thus, in these embodiments, the vertical movement will serve to partially straighten the initially curved leads. However, some slack should be left in the leads.

Figure 4:
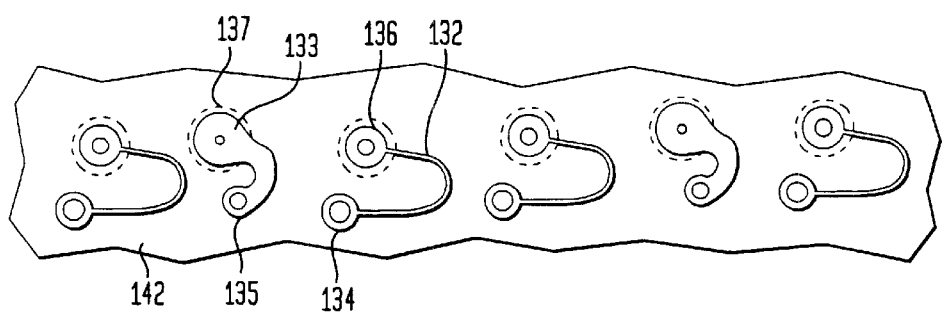
FIG. 4 shows further embodiments of the flexible leads shown in FIG. 1I including restraining straps in accordance with further preferred embodiments of the present invention.
Figure 5:
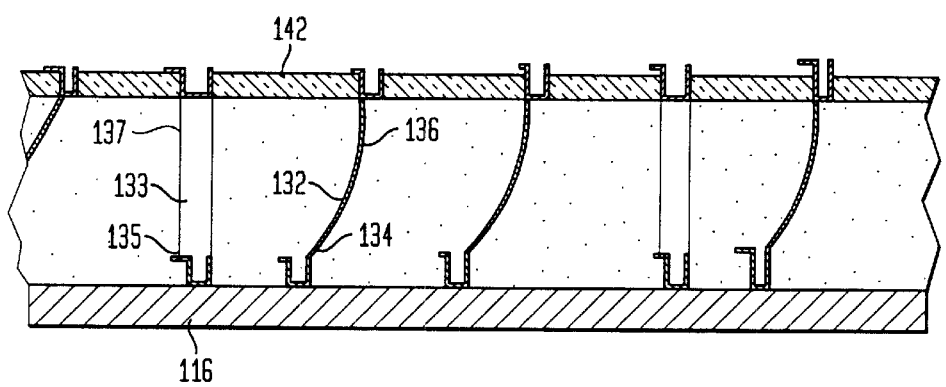
FIG. 5 shows the flexible leads and restraining straps of FIG. 4 after such leads have been connected to an element and deformed into a generally vertical orientation.

Referring to FIGS. 4 and 5, in certain preferred embodiments restraining straps 133, which are shorter and stronger than the flexible leads 132, are connected between dielectric element 142 and copper sheet 116. Restraining straps 133 may be formed during the same process steps used to make the flexible leads 132. Such restraining straps 133 are disclosed in commonly assigned U.S. Pat. No. 5,976,913 the disclosure of which is hereby incorporated by reference herein. The remaining straps 133 limit the movement of microelectronic elements away from one another so that sufficient slack remains in the flexible leads after the elements have been moved away from one another. Referring to FIG. 5, as the dielectric layer 142 and the copper layer 116 are moved away from one another, the first ends 134 of the flexible leads 132 and the first ends 135 of the restraining straps 133 are peeled away from the dielectric layer 142 so that the first ends 134, 135 are moved vertically away from the respective second ends 136, 137 of the leads. The restraining straps 133 eventually reach a substantially straight, fully extended condition, as shown in FIG. 5. In this condition, the restraining straps 133 arrest further vertical movement of the elements 142, 116 away from one another. Because the restraining straps 133 are shorter than the flexible leads 132, the restraining straps 133 will reach this condition while flexible leads 132 are still slack and still partially curved. Typically, the assembly will include a relatively small number of restraining straps and a relatively large number of flexible leads. Therefore, any additional area consumed by providing relatively large, robust restraining straps is likely to be minimal.

Referring to FIG. 1I, during or after movement of the dielectric layer 42 away from the copper layer 16, an encapsulant 56, such as a curable liquid material, is preferably introduced between the dielectric layer 42 and the copper layer 16 and around the flexible leads 32, as set forth in the above-mentioned '441 patent. The encapsulant preferably has a low viscosity and is introduced in an uncured state. The encapsulant 56 desirably wets the dielectric layer 42 and the copper layer 16 and effectively fills the gap therebetween and penetrates between all of the flexible leads 32. In this particular embodiment, the encapsulant is selected so that it will form a compliant material, such as a gel or an elastomer, upon cure. In other embodiments, preferred encapsulants include silicones, silicone elastomers, silicone gels, flexibilized epoxies and epoxies. The encapsulant may be rigid or compliant. In some embodiments the encapsulant around the leads is rigid and the remainder of the encapsulant between the dielectric layer and the substrate is compliant. In other embodiments, the encapsulant around the leads is compliant and the remainder of the encapsulant between the dielectric layer and the substrate is rigid.

The encapsulant may be injected under external pressure or else may be injected without external pressure and allowed to fill the space only by capillary action. Alternatively, the curable liquid encapsulant may have a pressure level that causes the dielectric layer and the copper layer to move away from one another. In this case, movement of the elements away from one another is restrained by the platens 55 and 59. After being provided between the elements and around the leads, the curable material is cured in place. Depending upon the formulation of the curable liquid material, such curing may take place spontaneously at room temperature or else may require exposure to heat or radiant energy.

Figure 1J:
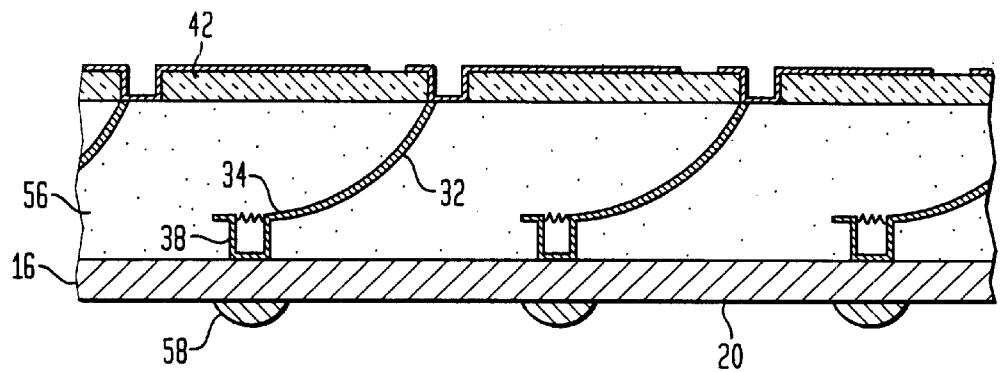

Referring to FIG. 1J, before or after formation of the compliant layer 56, etch resistant spots 58 are applied on the bottom surface 20 of the copper layer 16 in order to form conductive terminals as disclosed in commonly assigned U.S. Pat. No. 5,989,936, the disclosure of which is hereby incorporated by reference herein. The etch resistant spots 58 are applied in registration with the projections 38 at the first ends 34 of the flexible leads 32. The etch resistant spots 58 are preferably formed of a conductive material such as gold, platinum, solder or the like. The etch resistant spots may also be formed of a photoresist material. Following application of the etch resistant spots 58, the assembly is exposed to an etchant, such as HCl or CuCl. The etchant may be applied by immersing the assembly in the etchant or by spraying the etchant against the bottom surface 20 of the copper layer 16. The compliant layer 56 and the dielectric layer 42 protect the flexible leads 32 from the etching solution during the etching process.

Figure 1K:
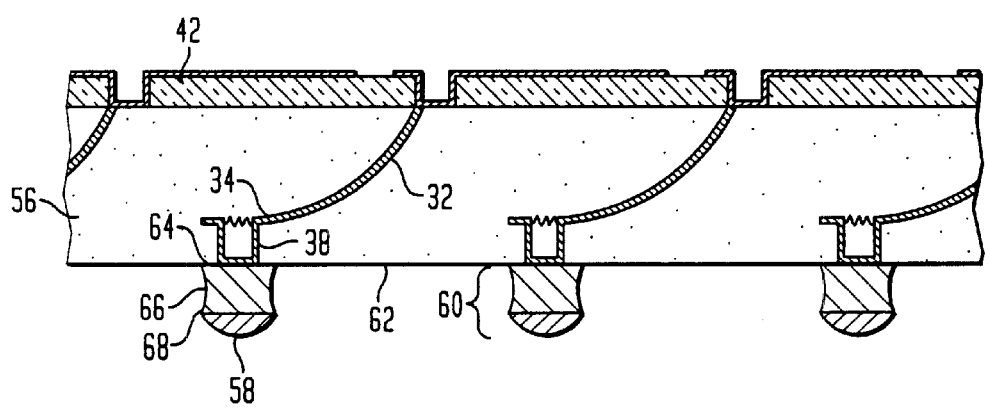

Referring to FIG. 1K, the etchant removes the metal of the copper layer 16 except in the areas covered by the etch resistant spots 58, thereby subdividing the copper layer and forming individual conductive terminals 60 projecting from a bottom surface 62 of the compliant layer 56. The size of the conductive terminals shown in FIG. 1K has been greatly exaggerated for clarity. The conductive terminals 60 are vertically interconnected to the projections 38 at the first ends 34 of the flexible leads 32. The etchant is preferably sprayed at a relatively high angle with respect to the bottom surface of the copper sheet (FIG. 1J) so that the etchant impinges on the bottom surface with a velocity vector directed almost perpendicularly to the bottom surface. This promotes formation of terminals having a "cooling tower shape" as shown in FIG. 1K.

As used herein and referring to FIG. 1K, "cooling tower shape" refers to a body having relatively large cross-sectional dimension at a base 64 adjacent the projection 38, that tapers inwardly to narrow, cross-sectional dimension at a neck 66, and that tapers outwardly again to larger cross-sectional dimension at a lower end 68 remote from the base end 64 thereof. As disclosed in the above-mentioned '312 patent application, the cross-sectional shapes of the terminals 60 can be controlled by controlling the shape of etch resistant spots 58. Thus, where the etch resistant spots 58 are circular, the conductive terminals 60 will be formed substantially as cooling tower shapes which are bodies of revolution about a vertical axis, and hence will have circular cross-sectional shapes. In further embodiments, where the etch-resistant spots are polygonal, such as where the spots are square or triangular, the terminals will have cooling tower shapes of polygonal cross-section.

Figure 1L:
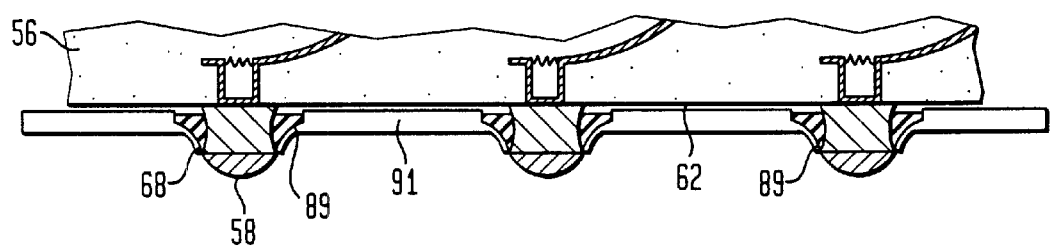

Referring to FIG. 1L, after the copper layer has been etched away, the conductive terminals 60 project from the bottom surface 62 of the compliant layer 56 so that the terminals may be readily inserted in a test socket or a socket connected with contacts on a microelectronic element, such as a semiconductor chip, a wafer, or a circuit board. Preferred circuit boards include circuitized FR-4 and circuitized ceramic. The terminals may also be directly connected to a microelectronic element having contacts. The microelectronic element may be another connection component of the present invention.

Referring to FIG. 1L, as described in commonly assigned U.S. patent application Ser. No. 08/366,236, now abandoned, the disclosure of which is hereby incorporated by reference herein, the formation of conductive terminals 60 having "cooling tower shapes" are particularly preferred because such terminals may be reliably secured in small resilient sockets 89, whereby the lower ends 68 of the cooling tower shaped terminals 60 will resist disengagement from the resilient sockets 89. During testing of the compliant connection component, the terminals 60 may be received in a single large fixture 91 having many sockets 89. After testing, the connection component may be disengaged from the fixture 91.

Because a major portion of the copper layer 16 has been etched away to form the conductive terminals, individual terminals are movable relative to one another and relative to the dielectric layer 42. The compliant layer 56 further mechanically decouples the conductive terminals 60 from the dielectric layer 42. Such movability allows compensation for effects such as thermal expansion and contraction during use.

Figure 6A:
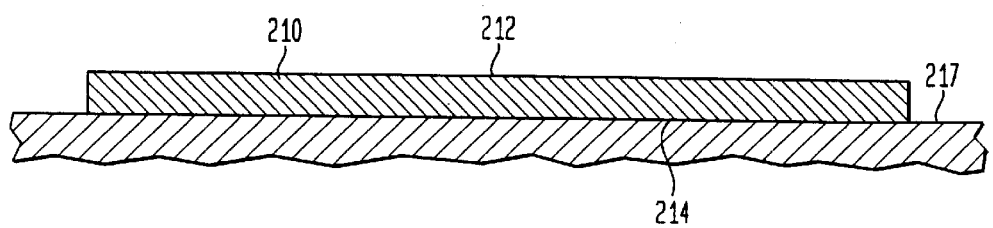
FIGS. 6A–6F show a method of making flexible leads for a compliant connection component in accordance with a further embodiment of the present invention.
Figure 6B:
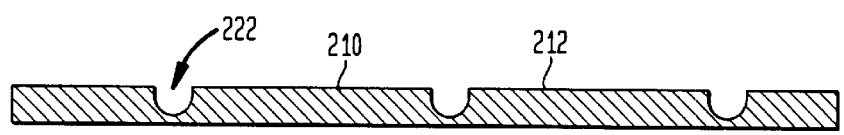
Figure 6C:
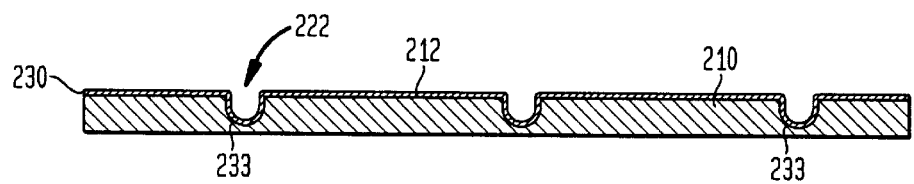
Figure 6D:
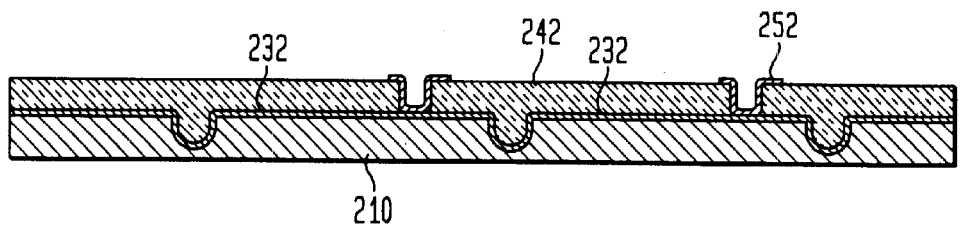
Figure 6E:
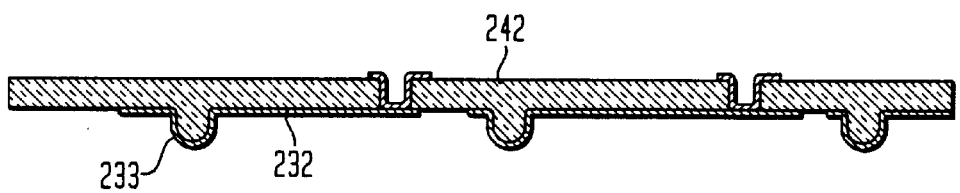
Figure 6F:
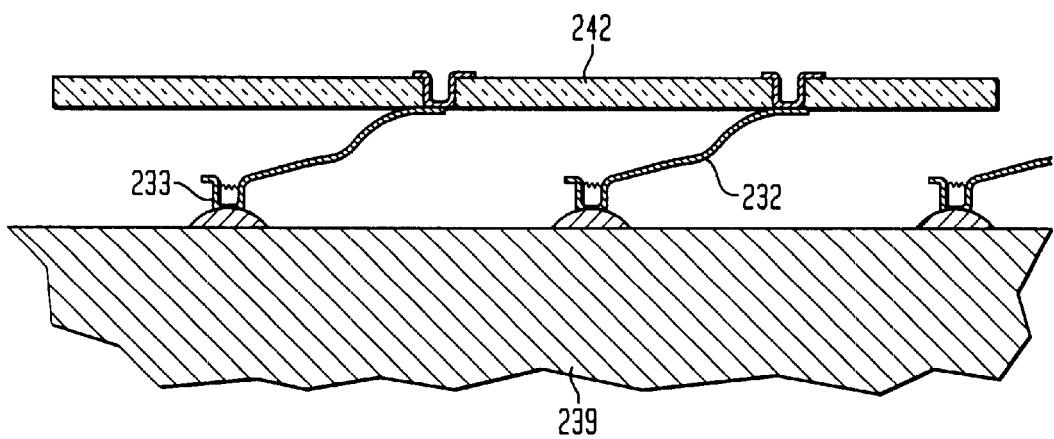

FIGS. 6A–6F show another embodiment of the present invention that is substantially similar to the embodiment shown in FIGS. 1A–1L, however, in this embodiment the vias in the removable layer are blind vias that extend only partially toward the second surface of the removable layer. Referring to FIG. 6A, removable layer 210 having first and second surfaces 212, 214 is provided over a supporting surface 217, without any underlying conductive sheet. Referring to FIG. 6B, vias 222 are then formed in the removable layer 210 extending from the first surface 212 toward the second surface 214 thereof. However, the vias 222 are blind vias that extend only partially through the removable layer 210. In certain embodiments, the blind vias 222 may be formed by allowing an etchant to remain in contact with the removable layer for a predetermined amount of time and removing the etchant before it is able to etch entirely through the removable layer 210 to the conductive sheet 216. Referring to FIG. 6C, a conductive metal layer 230 is then deposited over the first surface 212 of the removable layer 210 and in the blind vias 222 formed therein so as to form projections 233 integral with layer 230. The subassembly is preferably further fabricated using the steps set forth above when discussing FIGS. 1A–1L. Referring to FIG. 6D, after the conductive metal layer is etched to form individual leads 232, a dielectric layer 242 is applied, and terminals 252 are formed in the manner discussed above. In other embodiments, the terminals may be formed after the removable layer has been removed. Referring to FIG. 6E, the removable layer is removed, leaving projections 233 protruding downwardly and away from dielectric layer 242. The cup-shaped portions of the projections 233 are filled with dielectric material. Referring to FIG. 6F, the protrusions may be bonded to a microelectronic element 239, which may be moved away from the dielectric layer 242 to deform the leads 232. The cup-shaped projections 233 at the first ends of the leads retain dielectric material from dielectric layer 242 therein.

Figure 7A:
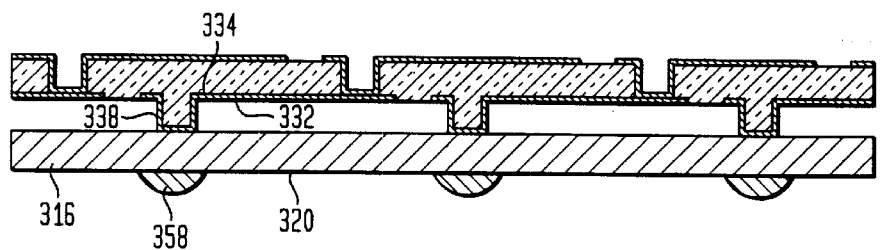
FIGS. 7A–7C show a method of making a compliant connection component in accordance with a further embodiment of the present invention.
Figure 7B:
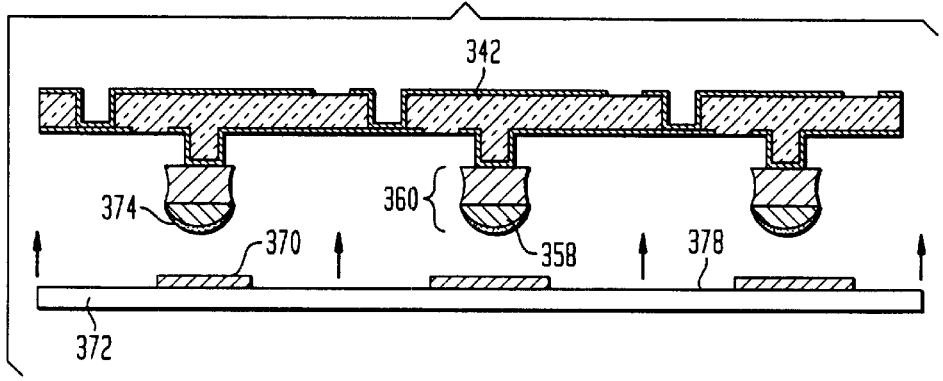
Figure 7C:
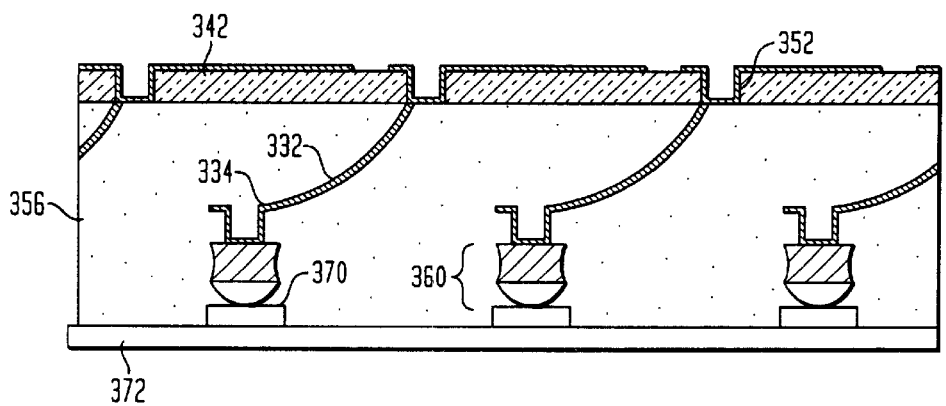

FIGS. 7A–7C show another method of making a compliant connection component in accordance with further preferred embodiments of the present invention. Referring to FIG. 7A, after a removable layer has been removed, etch resistant spots 358 are provided over the second surface 320 of the copper layer 316, the spots 358 being in registration with projections 338 at first ends 334 of flexible leads 332. Referring to FIG. 7B, the copper sheet 316 is then subdivided into conductive terminals 360 by etching away those portions of the copper sheet that are not covered by the etch resistant spots 358. A bonding material 374, such as solder or a eutectic bonding material, is then provided over the lower ends of the conductive terminals and the connection component subassembly is juxtaposed with a microelectronic element 372 so that the contacts 370 thereon are in registration with the conductive terminals 360.

Referring to FIGS. 7B and 7C, the dielectric element 342 and the conductive terminals 360 are juxtaposed with a contact-bearing surface 378 of a microelectronic element 372 so that the conductive terminals 360 including the conductive bonding material 374 are in registration with the contacts 370 on the microelectronic element 372. The assembly is then subjected to heat and pressure so as to engage the conductive terminals 360 with the contacts 370. The conductive bonding material 374 forms a metallurgical bond and electrical connection between the flexible leads 332 and the contacts 370 on the microelectronic element 372, thereby electrically interconnecting the terminals 352 and the contacts 370.

The microelectronic element 372 and the dielectric layer 342 are then moved away from one another in a controlled fashion, preferably by using platens, so as to peel the first ends 334 of the flexible leads 332 away from the bottom of the dielectric layer 342 and deform the leads 332 into the generally vertical, curved orientation shown in FIG. 7C. A curable material 356 may then be introduced between the dielectric layer 342 and the microelectronic element 372 and around the leads 332. The curable liquid material is then cured to provide a compliant layer 356 between the dielectric layer 342 and the microelectronic element 372, the compliant layer facilitates movement and flexing of the leads 332 during installation, testing, and/or operation of the microelectronic element 372. The resulting assembly can be mounted to one or more microelectronic elements including a circuit panel, a substrate, or one or more semiconductor chips. In addition, the connection component may be fabricated as a large component for simultaneous attachment to all of the chips in a single wafer, followed by severance of one or more chips from the wafer to form individual packages having one or more chips. Alternatively, the connection component may be fabricated in a single chip size and attached to a single chip after severance of the chip from the wafer.

Figure 8A:
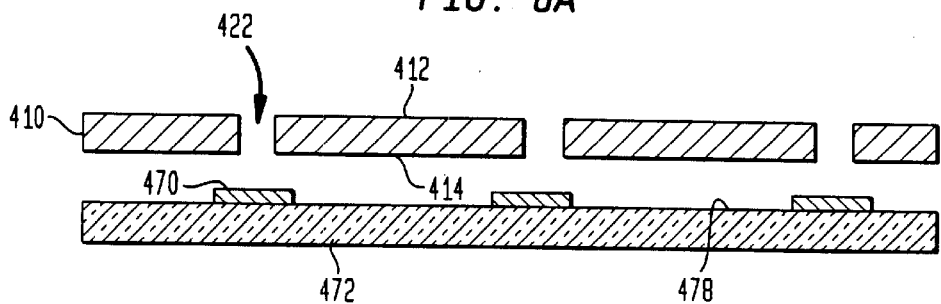
FIGS. 8A–8I show a method of making a compliant connection component in accordance with still further preferred embodiments of the present invention.
Figure 8B:
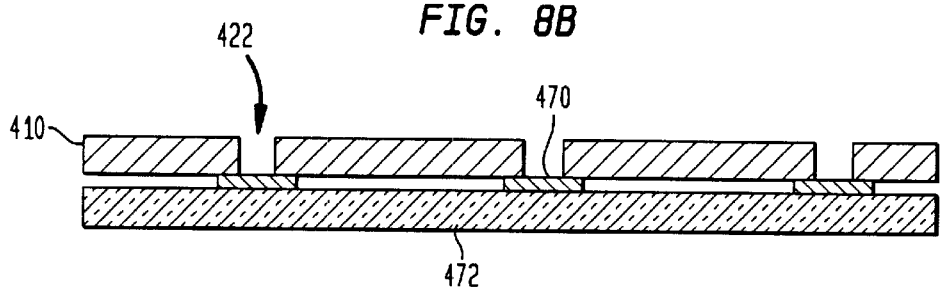
Figure 8C:
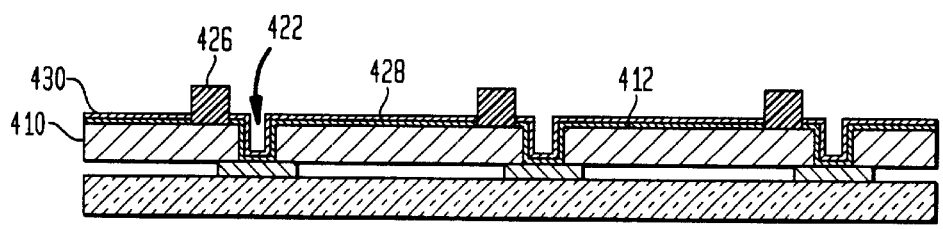

FIGS. 8A through 8I show a method of forming a compliant connection component in accordance with further preferred embodiments of the present invention. Referring to FIG. 8A, removable layer 410 is juxtaposed with the contact bearing surface 478 of a microelectronic element 472, such as a flexible dielectric tape having contacts 470. The removable layer 410 has a first surface 412 and a second surface 414 remote therefrom and through vias 422 extending therethrough from the first surface 412 to the second surface 414. Referring to FIG. 8B, the removable layer 410 is then placed in contact with the microelectronic element 472 so that the through vias 422 are in registration with the contacts 470 on the microelectronic element 472. Referring to FIG. 8C, in order to prepare for a lead forming step, a resist 426 is provided adjacent the through vias 422. A seed layer 428, such as chromium, is then deposited over the first surface 412 of the removable layer 410, in the through vias 422, and over the surface of the contacts 470 accessible through vias 422.

Figure 8D:
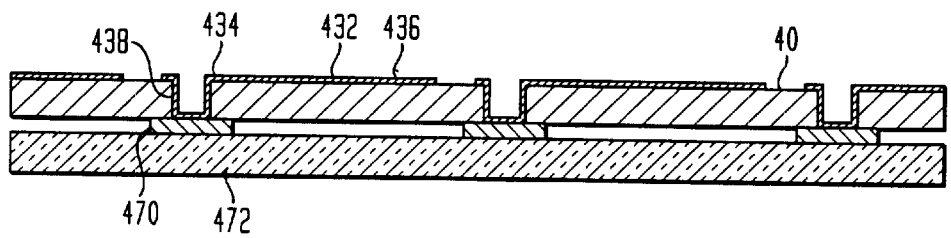

Referring to FIG. 8D, a conductive metal 430 is then deposited over the seed layer (FIG. 8C), such as by using plating, chemical vapor deposition or sputtering techniques. The conductive metal is selectively deposited to form flexible leads 432. Each flexible lead 432 has a first end 434, a projection 438 extending vertically downward toward the microelectronic element 472 that is integrally connected to the first end 434 of the lead 432, and a second end 436 remote therefrom. The projections 438 are hollow, and are generally cup-shaped with a lower end electrically connected (e.g. welded) to the contacts 470.

Figure 8E:
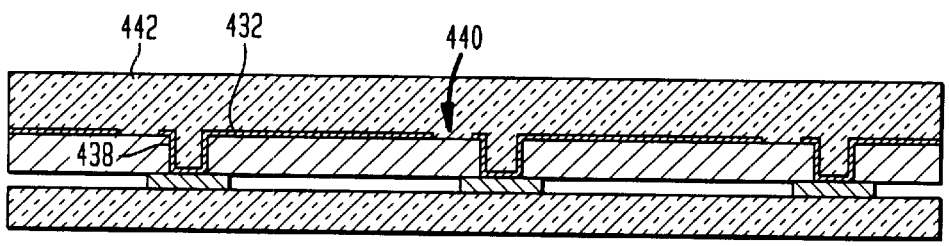
Figure 8F:
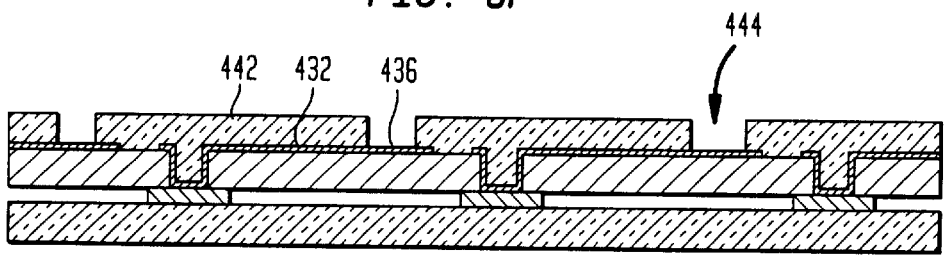

Referring to FIG. 8E, a dielectric layer 442 is then provided over the flexible leads 432. The dielectric layer 442 extends into the gaps 440 between adjacent leads 432 and into the hollow portions of the projections 438. Next, as shown in FIG. 8F, blind vias 444 are formed in the dielectric layer 442 extending to the second ends 436 of the flexible leads 432 for exposing the second ends 436 thereof. The layer of dielectric material will typically not adhere well to the conductive leads so that it may not be necessary to pre-treat the leads so as to form low-strength adhesion between the leads and the dielectric layer. However, the first ends of the leads may be treated so as to have less adhesion with the dielectric layer than the second ends of the leads by using the techniques set forth in commonly assigned U.S. patent application Ser. No. 09/020,750, now abandoned, as well as commonly assigned U.S. Pat. Nos. 5,763,941, 6,357,112 and 6,361,959, the disclosures of which are hereby incorporated by reference herein.

Figure 8G:
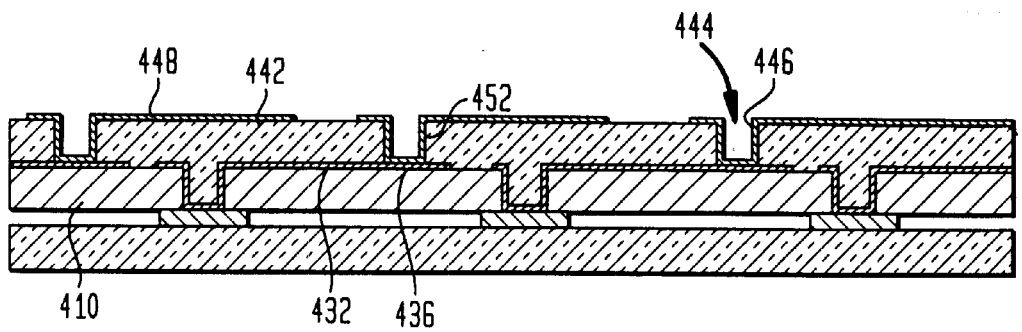

In FIG. 8G, a second layer of conductive metal 448 is provided atop the dielectric layer 442 and in the blind vias 444 formed therein. The conductive metal 448 coats the side walls 446 of the blind vias 444 as well as those sections of the second ends 436 of the leads 432 accessible through the blind vias 444 to form conductive terminals 452 connected to the second ends 436 of the leads 432. The conductive terminals 452 include lower ends that are bonded to the second ends 436 of the flexible leads 432.

Figure 8H:
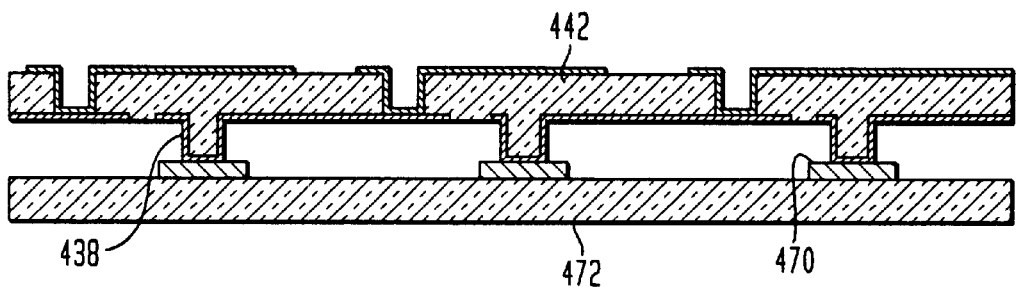
Figure 8I:
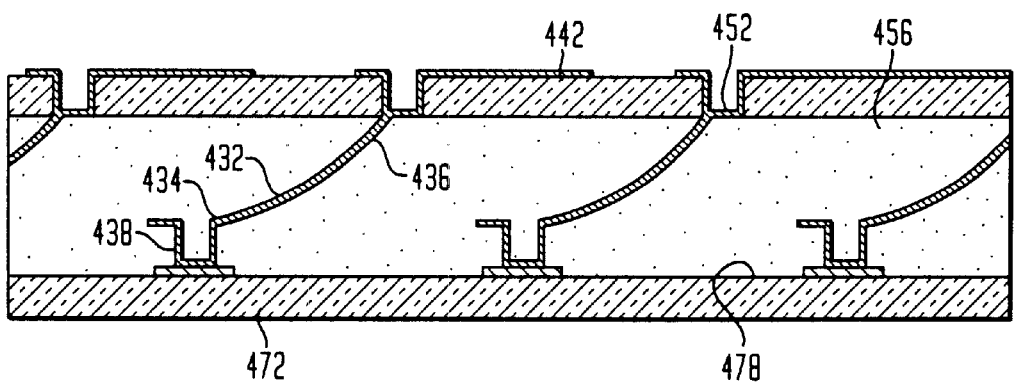
Figure 9:
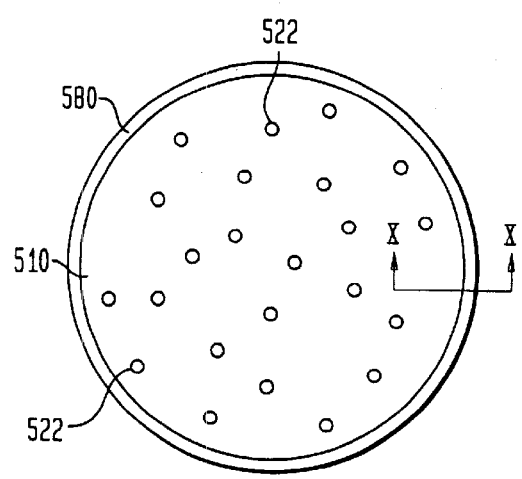
FIG. 9 shows a top view of a support ring securing a removable layer in a method of making a compliant connection component in accordance with yet further preferred embodiments of the present invention.

In FIG. 8H, the subassembly is exposed to an etchant solution for removing the removable layer (FIG. 8G) between the dielectric layer 442 and the microelectronic element 472 and from around the projections 438 electrically connected to the contacts 470. Residual etchant may be rinsed out of the assembly. Referring to FIG. 8I, the microelectronic element 472 and the dielectric layer 442 are moved away from one another, whereupon the first ends of the leads 434 and the projections 438 integrally connected thereto are peeled away from the dielectric layer 442. The microelectronic element 472 and the dielectric layer 442 continue to be moved away from one another so that the flexible leads deform into a generally vertical direction extending away from the dielectric element 442. A curable liquid, such as a curable elastomer, is provided during or after movement between the bottom surface of the dielectric layer 442 and the top surface 478 of the microelectronic element 472 and around the flexible leads 432 including the projections 438 thereof. The curable liquid encapsulant is then subjected to a curing process for providing a compliant layer 456 surrounding the flexible leads 432. The microelectronic assembly, including the compliant connection component, may then be connected to an external element such as a circuit board or one or more semi-conductor chips. For example, the microelectronic element 472 may be connected to a circuit board and the terminals 452 integrally connected to the second ends 436 of the leads 432 may be connected to the contacts on a semiconductor chip (not shown). The microelectronic element may also be a semiconductor chip on a wafer that provides the added advantage of good registration due to the predictable nature of the removable layer properties.

Referring to FIGS. 9 and 10A–10E, in another preferred embodiment for making a compliant connection component, a support ring 580 surrounds the perimeter of removable layer 510 for securing the removable layer therein. The removable layer 510 includes a material that may be selectively removed, such as aluminum, and has a first surface 512, a second surface 514 remote therefrom and a plurality of through vias 522 extending therethrough. The through vias 522 are preferably formed using the methods set forth above such as drilling, laser ablating, punching or etching.

Figure 10A:
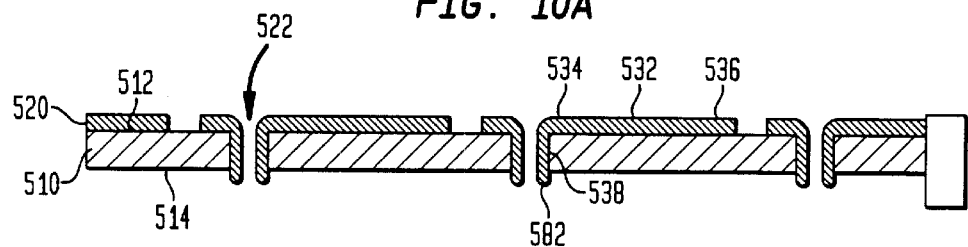
FIG. 10A shows a side view of FIG. 9 along line X—X of FIG. 9.

Referring to FIG. 10A, a conductive metal 520, such as copper, is then deposited over the first surface 512 of the removable layer 510 and in the through vias 522. The conductive metal is then etched to provide flexible leads 532 having first ends 534 integrally connected to rivet-shaped projections 538 and second ends 536 remote therefrom. Referring to FIG. 10C-2, the rivet-shaped projections 538 include lower ends 582 that extend below the second surface 514 of the removable layer 510. Methods for making such rivet-shaped projections are disclosed in commonly assigned U.S. Pat. Nos. 5,590,460 and 6,239,386, the disclosures of which are hereby incorporated by reference herein.

Figure 10B:
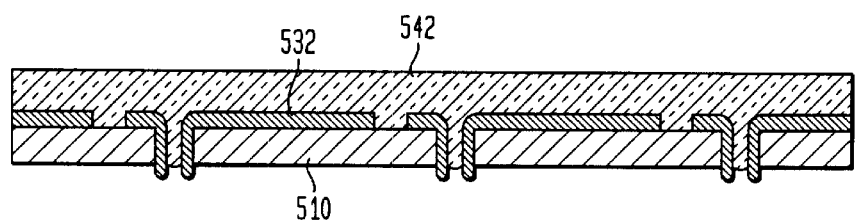
FIG. 10B shows a method of making a connection component using the support ring shown in FIGS. 9 and 10A, in accordance with certain preferred embodiments of the present invention.
Figures 1, 10C:
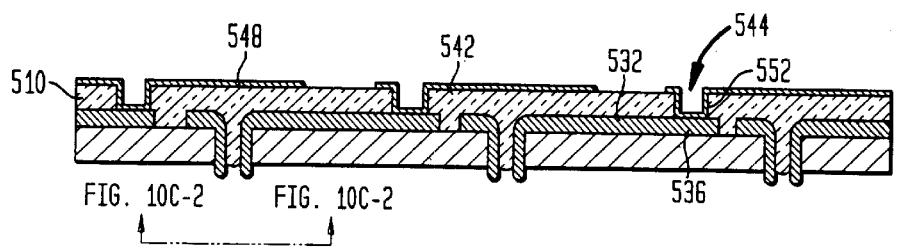
FIG. 10C-1 shows a further stage of a method of making a connection component using the subassembly of FIG. 10B.

Referring to FIG. 10B, the flexible leads 532 and the removable layer 510 are then covered with a layer of a dielectric material 542 using the processes described above. Referring to FIG. 10C-1, blind vias 544 are then selectively formed in the dielectric layer 542. The blind vias 544 extend to the second ends 536 of the flexible leads 532 for exposing the second ends thereof. A second layer of a conductive metal 548 is then deposited atop the dielectric layer 542 for forming conductive terminals 552 electrically connected to the second ends 536 of the flexible leads 532.

Figure 10D:
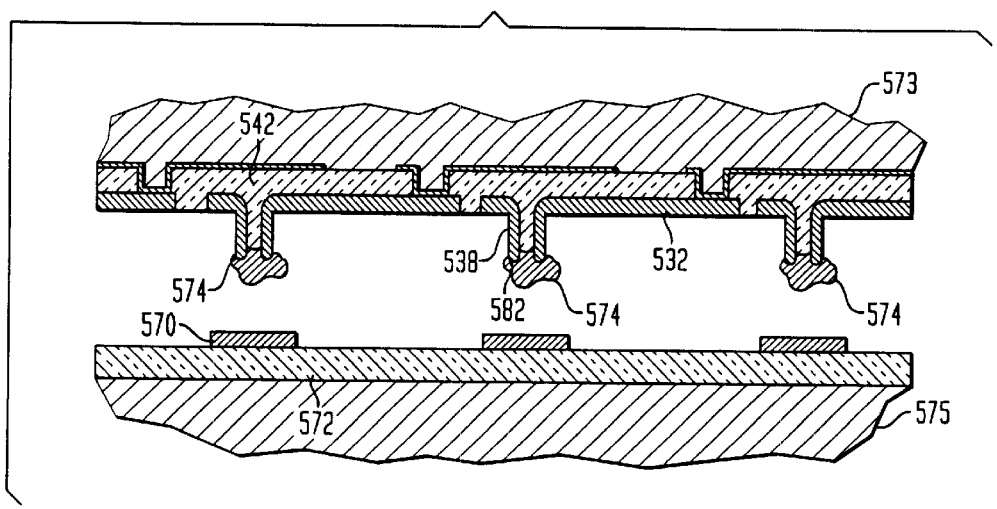
FIGS. 10D–10E show further stages of a method of making a connection component using the subassembly of FIG. 10C-1.

Referring to FIGS. 10C-1 and 10D, the removable layer 510 is removed using etchant that leaves the flexible leads 532 and the projections 538 integrally connected thereto substantially intact. After the removable layer has been removed, the projections 538 project from the bottom face of the dielectric layer 542, thereby enabling the lower ends 582 of the projections 538 to deform upon engagement with contacts 570 on a microelectronic element 572.

Figure 10E:
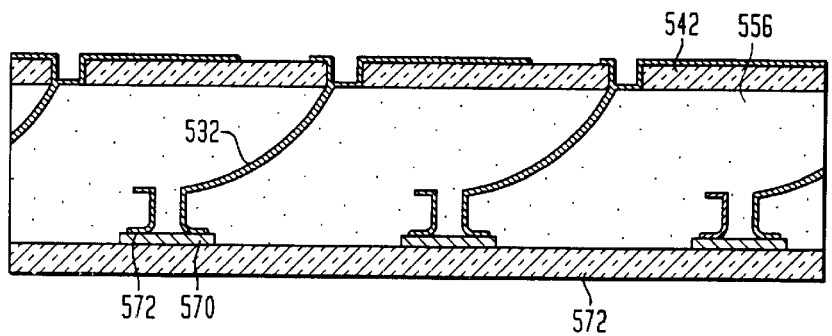
Figures 2, 10C:
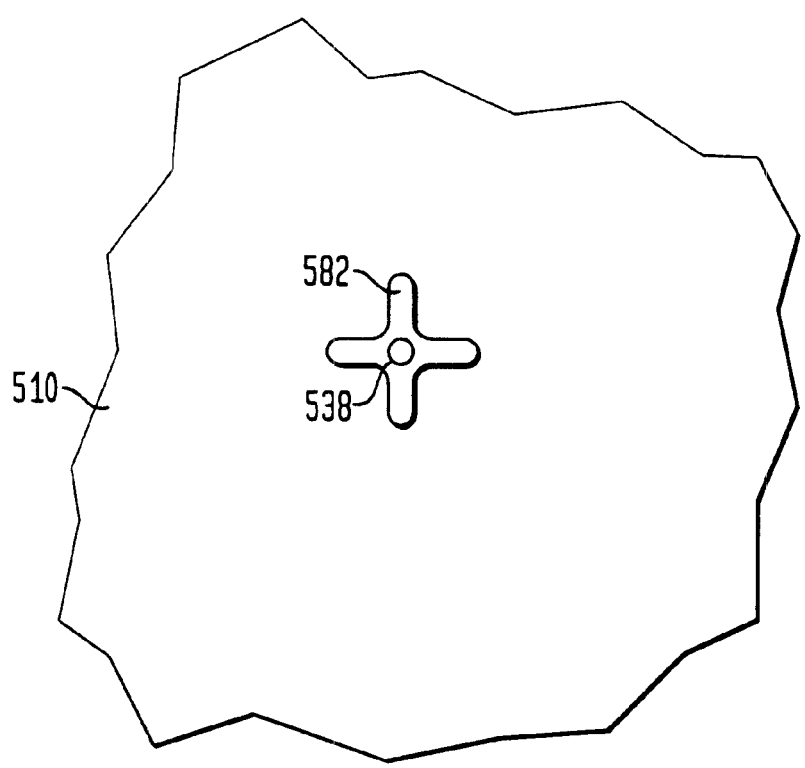

Referring to FIG. 10D, a conductive bonding material 574 is provided over the lower ends 582 of the projections 538 and the projections are brought into registration with the contact pads 570. When the projections 538 are brought into registration with the contacts 570, the lower ends 582 of the projections 538 are preferably centered over the contacts 570. The dielectric layer 542 and the microelectronic element 572 are then compressed together. A vacuum may be applied during the compressing step to remove air from between the elements. Element 572 may be forced against the dielectric layer by platens 573 and 575. As the stacked elements are compressed, the contacts 570 bear on the lower ends 582 of the projections 538. As best illustrated in FIG. 10E, this action tends to bend the lower ends 582 outwardly. As the lower ends 582 bend outwardly, a relatively large surface area of each projection 538 wipes over the surface of the contact 570 associated therewith. The wiping action promotes formation of effective electrical connections. Because the projections are separated from one other at their lower ends, the projections can be bent radially outwardly in this fashion without tearing or substantially cracking the structural material.

Referring to FIG. 10E, after the lower ends 582 of the leads 532 have been connected with the contacts 570, the microelectronic element 572 and the dielectric layer 542 are moved away from one another for deforming the leads 532 in a substantially vertical orientation. A curable liquid elastomer 556 is provided between the microelectronic element 572 and the dielectric layer 542 for forming a compliant layer therebetween for facilitating movement and flexing of the leads 532 in response to forces.

Figure 11A:
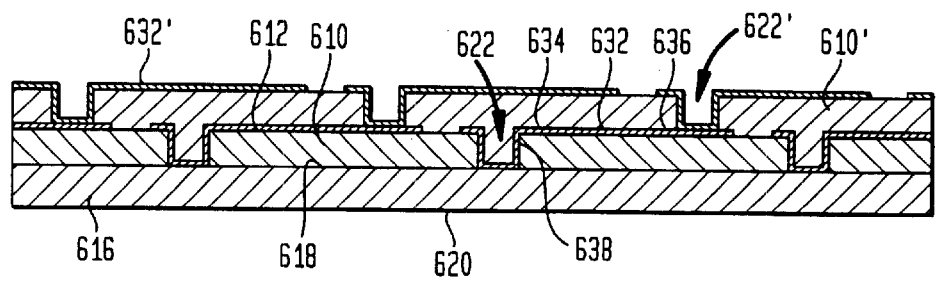
FIGS. 11A–11E show a method of making a multi-layer connection component in accordance with still further preferred embodiments of the present invention.

FIGS. 11A through 11E show another preferred method of making a compliant connection component that includes three or more layers. Referring to FIG. 11A, a connection component subassembly generally similar to that shown and described in FIG. 1G is provided. The connection component subassembly includes a copper layer 616 having a first surface 618 and a second surface 620 remote therefrom. A first removable layer 610 overlies the first surface 618 of the copper layer 616. The first removable layer 610 includes one or more vias 622 extending toward the first surface of the copper layer. The vias 622 are formed at spaced apart first locations of the first removable layer 610. One or more flexible leads 632 may then be formed at the first surface 612 of the first removable layer 610. The traces are preferably horizontal to the first surface of the first removable layer and may be connected to some or all of the flexible leads. Each lead 632 includes a first end 634 integrally connected with a projection 638 extending into the via 622 at one of the first locations and a second end 636 at a location remote from the first end 634 of the lead 632. The subassembly also includes a second removable layer 610' formed atop the first removable layer 610 including vias 622' extending toward the top surface 612 of the first removable layer 610 for exposing the second ends 636 of the flexible leads 632 formed thereon. A conductive metal 630' overlies the second removable layer 642 for forming a second series of flexible leads 632'. Preferably, at least some of the first flexible leads 632 are electrically connected to at least some of the second flexible leads 632'.

Figure 11B:
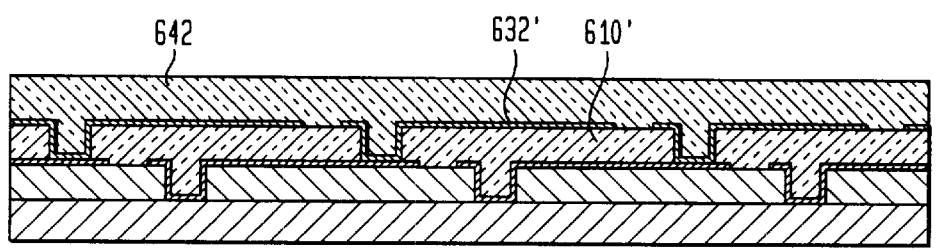
Figure 11C:
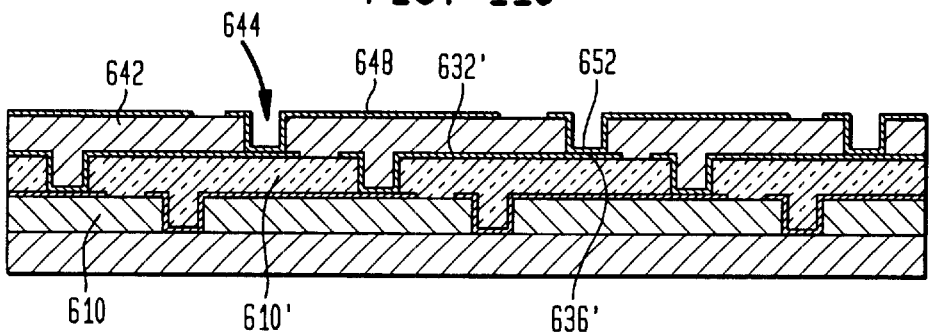
Figure 11D:
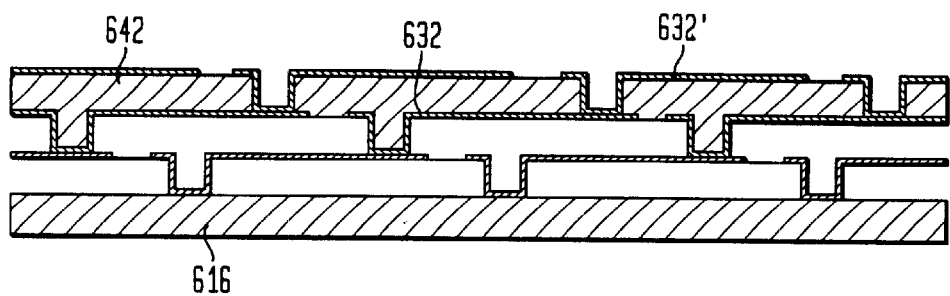

Referring to FIG. 11B, a layer of a dielectric material 642 is provided over the second flexible leads 632' and the second removable layer 610'. Referring to FIG. 11C, vias 644 are then formed in the dielectric layer 642 and a conductive metal 648 is deposited over the top surface of the dielectric layer 642 and in the vias 644 for forming conductive terminals 652 electrically connected to the second ends 636' of the second flexible leads 632'. Referring to FIG. 11D, the subassembly is then exposed to an etching process such as submersing the entire subassembly in an etching solution for removing the first and second removable layers 610 and 610' (FIG. 11C) between dielectric layer 642 and copper layer 616.

Figure 11E:
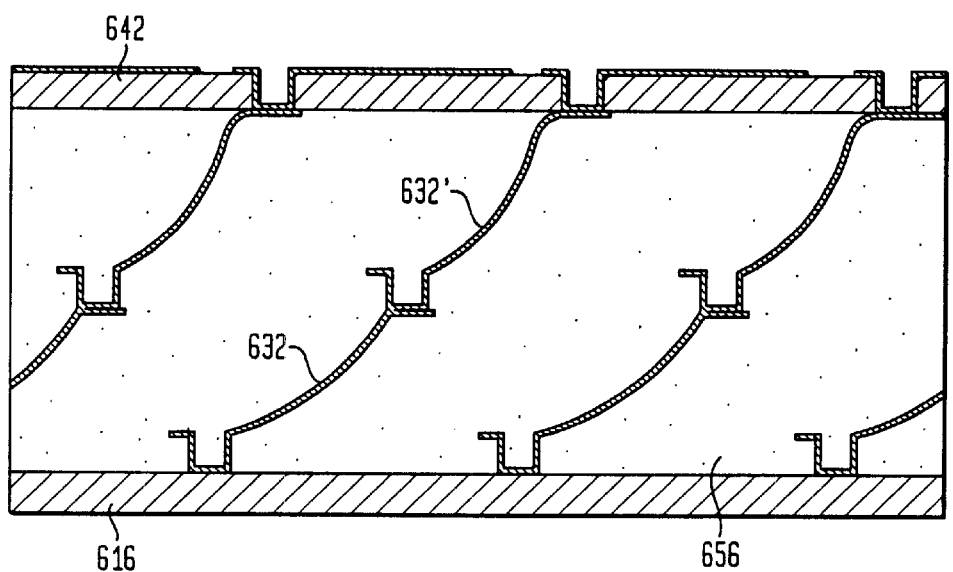

Referring to FIG. 11E, the copper layer 616 and the dielectric layer 642 are then moved away from one another in vertical directions for deforming the first and second sets of flexible leads 632, 632' into a generally vertical orientation. During or after movement, a curable liquid encapsulant 656 is introduced between the dielectric layer 642 and the copper layer 616 and around the flexible leads 632, 632'. The encapsulant 656 is then cured for providing a compliant layer surrounding the leads. The assembly of FIG. 11E may be utilized as a substrate, as a component for being attached to a substrate or another microelectronic element, or as an interposer between two microelectronic elements or between a microelectronic element and a substrate.

Figure 12A:
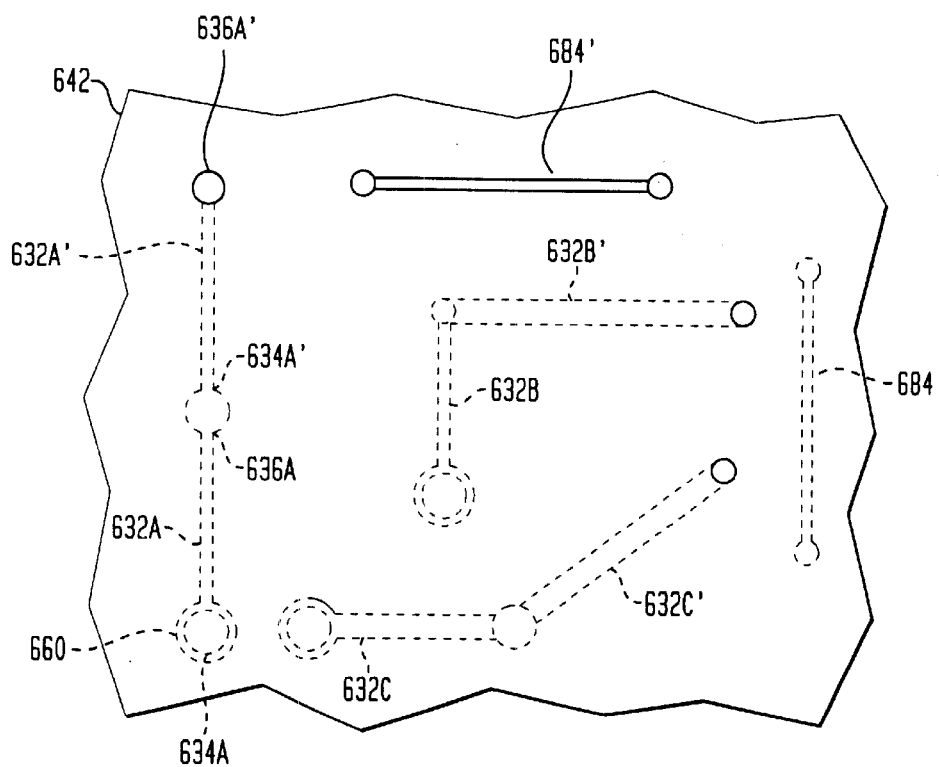
FIG. 12A shows a fragmentary top view of the assembly shown in FIG. 11E.
Figure 12B:
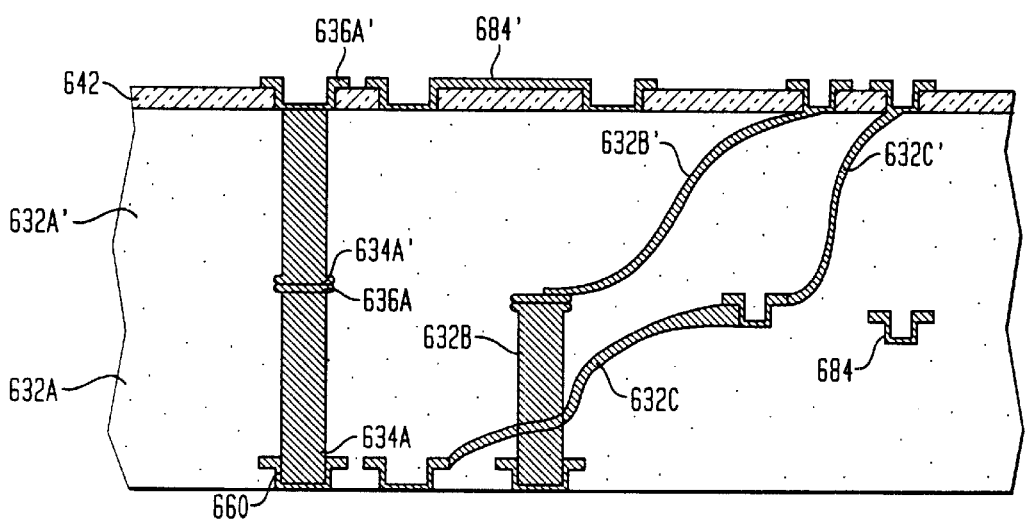
FIG. 12B shows a cross-sectional view of FIG. 12A.

FIGS. 12A and 12B show respective fragmentary top and cross-sectional views of FIG. 11E, including interconnected flexible leads 632', 632 extending through various layers of the connection component. As shown in FIGS. 12A and 12B, the flexible leads may extend in directions substantially parallel to one another, substantially perpendicular to one another, or at any angle therebetween. Lead 632A' extends through a second layer of the component and is electrically connected with lead 632A extending through a first layer of the component. The first layer lead 632A and the second layer lead 632A' are substantially parallel to one another. The second end 636A' of second layer lead 632A' is accessible at the top surface of dielectric layer 642 and the lead extends vertically downward through the second layer toward the first layer of the connection component. The first end 634A' of second layer lead 632A' is bonded to the second end 636A of first layer lead 632A. First layer lead 632A extends downwardly through the first layer to the first end 634A of the lead which is bonded to conductive terminal 660, the conductive terminal being accessible at the bottom surface of the connection component. FIGS. 12A and 12B also show second layer lead 632B' connected to first layer lead 632B, whereby the leads extend in directions substantially perpendicular to one another. The connection component also includes first layer lead 632C extending at an angle with respect to the direction of second layer lead 632C' (i.e., an angle between a parallel orientation and a perpendicular orientation). One or more electrically conductive traces 684 and 684' may also extend through the connection component. Conductive trace 684 extends through the first layer of the component. Conductive trace 684' extends atop the second layer of the component.

Figure 13A:
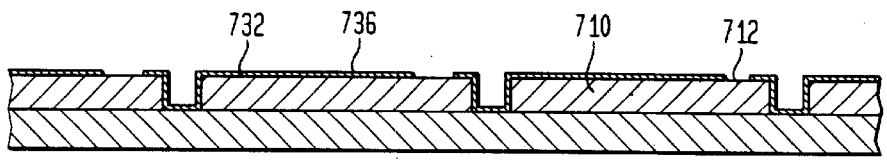
FIGS. 13A–13D show a method of making a connection component in accordance with further preferred embodiments of the present invention.
Figure 13B:
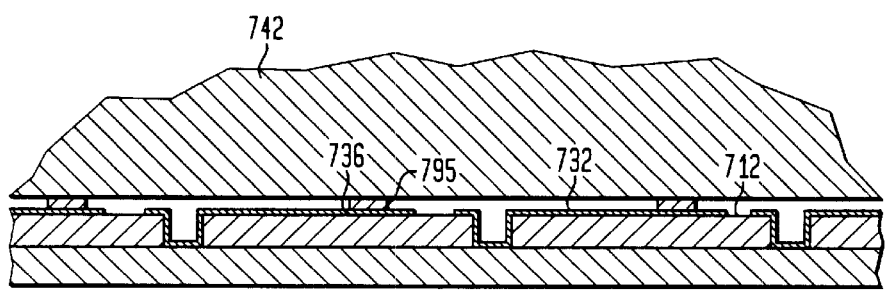

FIGS. 13A–13D show yet another method of making a component in accordance with further preferred embodiments of the present invention. The subassembly shown in FIG. 13A is desirably fabricated using the steps described above in reference to FIGS. 1A–1D. After flexible leads 732 have been formed atop the first surface 712 of removable layer 710, a substrate 742, such as a microelectronic element having contacts 795, is juxtaposed with the first surface 712 of the removable layer 710. The contacts 795 are placed in registration with the second ends 736 of the flexible leads 732. A conductive bond material (not shown) may be placed over the contacts and the contacts 795 abutted against the second ends 736 of the leads 732 for bonding the contacts 795 and the leads 732.

Figure 13C:
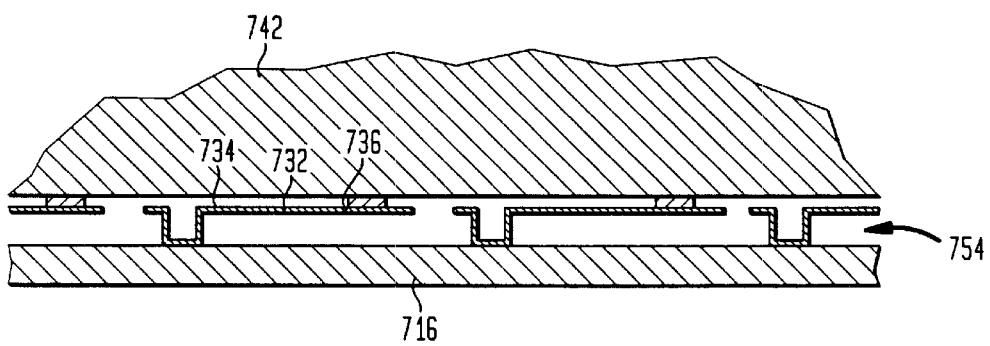

Referring to FIG. 13C, the removable layer is then removed using the steps disclosed above so as to leave a gap 754 between the microelectronic element 742 and conductive metal layer 716.

Figure 13D:
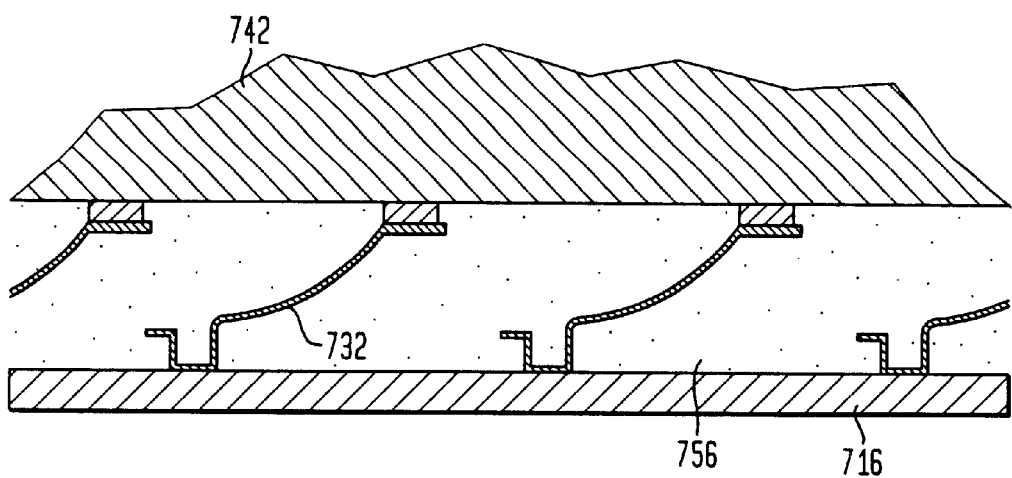

Referring to FIG. 13D, the microelectronic element 742 and the conductive metal layer 716 are then moved away from one another in a controlled fashion, preferably by using platens, so as to deform the leads 732 into the generally vertical, curved orientation. A curable material 756 may be introduced between the microelectronic element 742 and the conductive metal layer 716 and around the leads 732. The curable liquid material is then cured to provide a compliant layer 756 that enables the flexible leads 732 to move and flex during installation, testing, and/or operation of the assembly. The conductive layer 716 may then be subdivided into conductive terminals by etching away those portions of the layer that are not covered by etch resistant spots (not shown). The subassembly may then be juxtaposed with and connected to another microelectronic element. The resulting assembly can be mounted to one or more microelectronic elements including a circuit board, a wafer, a flexible circuit, a dielectric layer, a substrate, one or more packaged semiconductor chips, one or more bare semiconductor chips or a test socket.

Figure 14A:
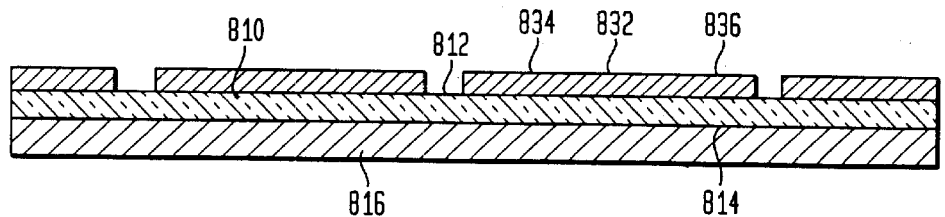
FIGS. 14A–14D show a method of making a connection component in accordance with still further preferred embodiments of the present invention.
Figure 14B:
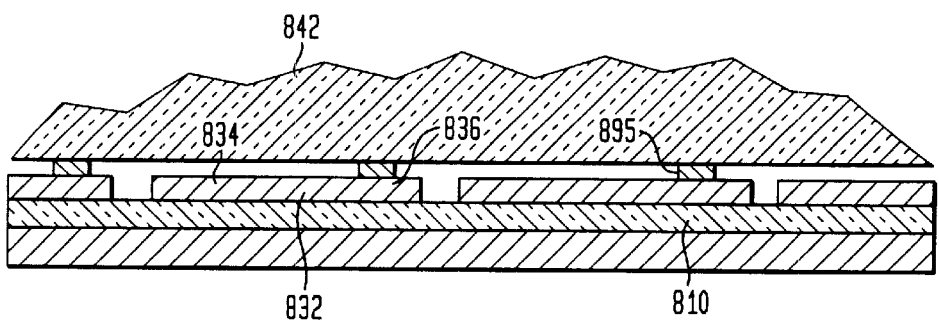

FIGS. 14A–14D show other methods of making a component in accordance with further preferred embodiments of the present invention. Referring to FIG. 14A, removable layer 810 having first and second surfaces 812, 814 is provided atop conductive metal layer 816. Conductive leads 832 having first ends 834 and second ends 836 are then formed atop the removable layer 810, preferably using the steps described above. Referring to FIG. 14B, after flexible leads 832 have been formed atop the removable layer 810, a substrate 842, such as a microelectronic element having contacts 895, is juxtaposed with the first surface 812 of the removable layer 810. The microelectronic element may be any element including conductive contacts, traces or leads including one or more semiconductor chips, a wafer, a dielectric film or a circuit board The contacts 895 are placed in registration with the second ends 836 of the flexible leads 832. A conductive bond material (not shown) may be placed over the contacts 895 before the contacts 895 are abutted against the second ends 836 of the leads 832 for bonding the contacts 895 and the leads 832.

Figure 14C:
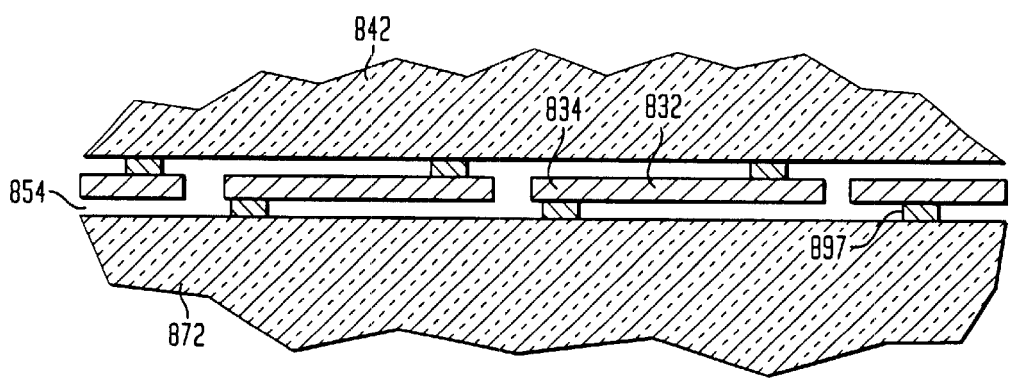

Referring to FIG. 14C, the removable layer 810 (FIG. 14B) is then removed using the steps disclosed above. The substrate 842 and leads 832 are then juxtaposed with an element 872, such as a circuit board having contacts 897. The circuit board contacts are placed in registration with the first ends 834 of the leads 832 and the contacts 897 and first lead ends 834 are electrically connected together, preferably by using a conductive bonding material. After the element 872 has been electrically connected to the first lead ends 834, a gap 854 exists between the microelectronic element 842 and substrate 872 (due to the removal of the removable layer).

Figure 14D:
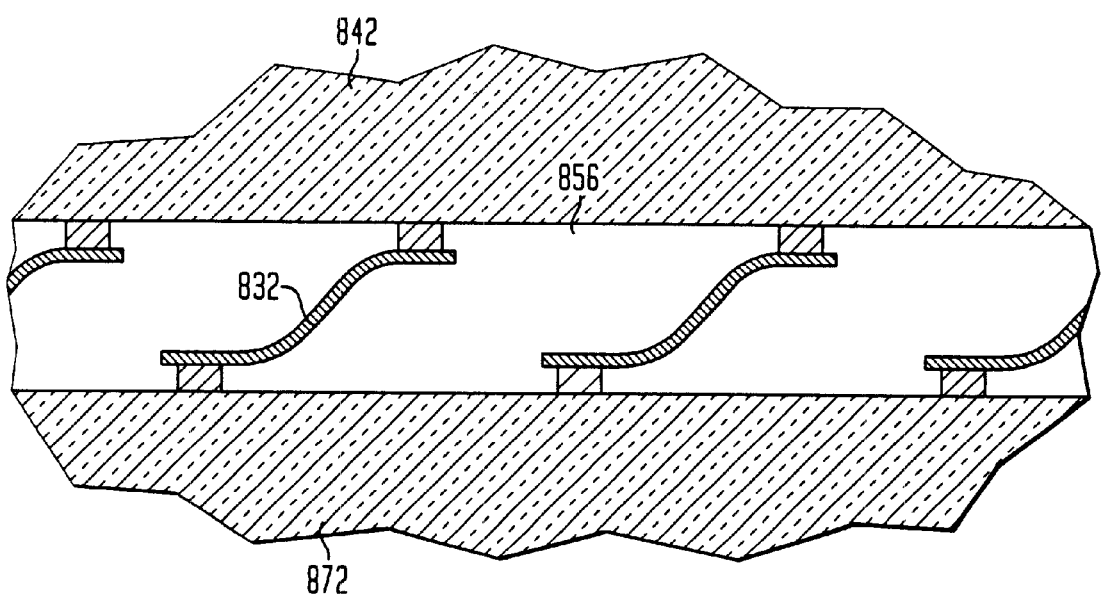

Referring to FIG. 14D, the microelectronic element 842 and substrate 872 are then moved away from one another in a controlled fashion, preferably by using platens, so as to deform the leads 832 into a generally vertical, curved orientation. A curable material 856 may then be introduced between the microelectronic element 842 and the substrate 872 and around the leads 832. The curable liquid material is then cured to provide a compliant layer 856 that enables the flexible leads 832 to move and flex during installation, testing, and/or operation of the assembly.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of making a component having one or more leads comprising:
   (a) providing a removable layer having vias at spaced apart first locations;
   (b) depositing a conductive material over said removable layer and in each said via so as to form said one or more leads, wherein each said lead includes a first end and a second end at a location remote from the first end of said lead;
   (c) providing a dielectric layer over said leads; and
   (d) removing said removable layer.

2. The method as claimed in claim 1, wherein the step of providing a removable layer includes:
   providing a removable layer having first and second surfaces; and
   forming vias at spaced apart first locations of said removable layer.

3. The method as claimed in claim 2, further comprising:
   providing a substrate having a first surface; and
   placing said removable layer atop the first surface of said substrate before the depositing a conductive material step, wherein the first ends of said leads are connected with said substrate during the depositing a conductive material step.

4. The method as claimed in claim 3, wherein said vias extend from the first surface to the second surface of said removable layer.

5. The method as claimed in claim 4, wherein the conductive material deposited in said vias forms projections at the first ends of said leads extending downwardly into said removable layer, said projections being connected with said substrate.

6. The method as claimed in claim 5, wherein said projections are generally hollow and wherein the dielectric layer fills the hollow portions of said projections during the providing a dielectric layer step.

7. The method as claimed in claim 6, wherein the hollow portions of said projections are generally square conformal liners.

8. The method as claimed in claim 1, further comprising coating the first ends of said leads with an adhesion-reducing substance before the providing a dielectric layer step for reducing adhesion between the dielectric layer and the first ends of said leads.

9. The method as claimed in claim 1, further comprising repeating steps (a)–(b) two or more times before performing step (c) so as to form a multi-layer assembly having two or more levels of said leads vertically disposed one over the other.

10. The method as claimed in claim 1, wherein the depositing a conductive metal step includes:
    depositing a seed layer over said removable layer and in each said via; and
    electroplating said conductive material over said seed layer.

11. The method as claimed in claim 1, wherein said removable layer includes metal.

12. The method as claimed in claim 1, wherein said removable layer includes aluminum.

13. The method as claimed in claim 1, wherein the step of removing the removable layer includes exposing said removable layer to an etching solution.

14. The method as claimed in claim 1, wherein the step of removing the removable layer includes laser ablating said removable layer.

15. The method as claimed in claim 1, wherein said removable layer includes a polymer.

16. The method as claimed in claim 1, further comprising providing a support ring for securing the removable layer during the depositing a conductive material step, wherein said conductive material forms rivet-shaped extensions projecting below a second surface of said removable layer.

17. The method as claimed in claim 16, wherein said rivet-shaped projections are integrally connected with the first ends of said leads.

18. The method as claimed in claim 1, further comprising:
   before the depositing a conductive material step, providing a microelectronic element having a contact bearing face; and
   juxtaposing the removable layer with the contact bearing surface of said microelectronic element so that the vias overlie the contacts, wherein the vias extend from a first surface to a second surface of said removable layer and wherein the first ends of the leads are connected with the contacts of said microelectronic element during the depositing a conductive material step.

19. The method as claimed in claim 18, wherein said microelectronic element is selected from a group consisting of a circuit board, a wafer, a flexible circuit, a dielectric layer, a test socket, a packaged semiconductor chip and one or more bare semiconductor chips.

20. The method as claimed in claim 18, further comprising, after removing the removable layer, moving said microelectronic element and said dielectric layer away from one another with a component of motion in a generally vertical direction for deforming said leads to a vertically-extensive disposition.

21. The method as claimed in claim 20, further comprising encapsulating the leads with a first encapsulant.

22. The method as claimed in claim 21, further comprising disposing a second encapsulant between the dielectric layer and the microelectronic element.

23. The method as claimed in claim 22, wherein the encapsulating the leads with a first encapsulant step and the disposing a second encapsulant step occur simultaneously.

24. The method as claimed in claim 22, wherein the first and second encapsulants comprise a common material.

25. The method as claimed in claim 22, wherein the steps of encapsulating with a first encapsulant and disposing a second encapsulant follow the moving step.

26. The method as claimed in claim 22, wherein the steps of encapsulating with a first encapsulant and disposing a second encapsulant occur during the moving step.

27. The method as claimed in claim 22, wherein the step of encapsulating the leads with a first encapsulant and disposing a second encapsulant includes introducing a curable liquid between said dielectric layer and said microelectronic element.

28. The method as claimed in claim 22, further comprising curing said curable liquid after the introducing step.

29. The method as claimed in claim 2, wherein the step of forming vias in said removable layer includes laser drilling said removable layer.

30. The method as claimed in claim 2, wherein the step of forming vias in said removable layer includes etching portions of said removable layer.

31. The method as claimed in claim 2, wherein the conductive material deposited over the first surface of said removable layer includes copper.

32. The method as claimed in claim 2, wherein said vias extend only partway between the first surface and the second surface of said removable layer.

33. The method as claimed in claim 32, further comprising forming vias extending through the dielectric layer so as to expose the second ends of said leads.

34. The method as claimed in claim 33, further comprising depositing a conductive material in said vias of said dielectric layer for forming second conductive terminals electrically connected to the second ends of said leads.

35. The method as claimed in claim 34, wherein the first ends of said leads are exposed at a bottom surface of said dielectric layer after the step of removing said removable layer.

36. The method as claimed in claim 35, further comprising:
   providing a microelectronic element having a contact bearing face;
   connecting the first ends of the exposed leads with the contact bearing face of the microelectronic element.

37. The method as claimed in claim 36, further comprising:
   providing a second microelectronic element having a contact bearing face; and
   connecting the second ends of the leads with the contact bearing face of the second microelectronic element.

38. The method as claimed in claim 37, wherein one of the first and second microelectronic elements is a circuit board and the other microelectronic element is a semiconductor chip.

39. The method as claimed in claim 36, further comprising, after the connecting step, moving said dielectric layer and said microelectronic element away from one another with a component of motion in a generally vertical direction for deforming said leads to a vertically-extensive disposition.

40. The method as claimed in claim 39, further comprising providing an encapsulant between said dielectric layer and said microelectronic element.

41. The method as claimed in claim 4, wherein the first ends of the leads are releasably connected to the dielectric layer.

42. The method as claimed in claim 4, further comprising, after the removing said removable layer step, moving said dielectric layer and said substrate away from one another with a component of motion in a generally vertical direction for deforming said leads to a vertically-extensive disposition.

43. The method as claimed in claim 42, wherein one or more of the vertically-extended leads are flexible.

44. The method as claimed in claim 42, wherein the step of moving said dielectric layer and said substrate away from one another includes peeling the first ends of said leads away from said dielectric layer.

45. The method as claimed in claim 42, further comprising before the moving step providing restraining straps connected to the dielectric layer and the substrate for limiting movement of the dielectric layer and the substrate away from one another.

46. The method as claimed in claim 44, wherein the restraining straps are thicker and shorter than the leads.

47. The method as claimed in claim 42, further comprising forming vias in said dielectric layer extending toward said removable layer so as to expose the second ends of said leads.

48. The method as claimed in claim 47, further comprising depositing a conductive material in said vias of said dielectric layer for forming second conductive terminals electrically connected to the second ends of said leads.

49. The method as claimed in claim 48, wherein each said second conductive terminal includes a solder ball.

50. The method as claimed in claim 48, wherein the conductive material deposited in said vias of said dielectric layer includes copper.

51. The method as claimed in claim 48, wherein said second conductive terminals are generally cup-shaped and have openings facing away from the removable layer.

52. The method as claimed in claim 48, further comprising:
providing a microelectronic element having contacts; and
electrically connecting the contacts of the microelectronic element with the second conductive terminals.

53. The method as claimed in claim 52, further comprising:
providing a second microelectronic element having a contact bearing face; and
connecting the second ends of the leads with the contact bearing face of the second microelectronic element.

54. The method as claimed in claim 53, wherein one of the first and second microelectronic elements is a circuit board and the other one of the first and second microelectronic elements is a semiconductor chip.

55. The method as claimed in claim 12, further comprising encapsulating the leads with a first encapsulant.

56. The method as claimed in claim 55, wherein the first encapsulant is rigid.

57. The method as claimed in claim 55, wherein the first encapsulant is compliant.

58. The method as claimed in claim 55, further comprising disposing a second encapsulant between the dielectric layer and the substrate.

59. The method as claimed in claim 58, wherein the second encapsulant is rigid.

60. The method as claimed in claim 58, wherein the second encapsulant is compliant.

61. The method as claimed in claim 58, wherein the steps of encapsulating the leads with a first encapsulant and disposing a second encapsulant between the dielectric layer and the substrate occur simultaneously.

62. The method as claimed in claim 58, wherein the first and second encapsulants comprise a common material.

63. The method as claimed in claim 58, wherein the steps of encapsulating the leads with a first encapsulant and disposing a second encapsulant between the dielectric layer and the substrate includes introducing a curable liquid between the dielectric layer and the substrate.

64. The method as claimed in claim 63, further comprising curing said curable liquid after the introducing step.

65. The method as claimed in claim 42, wherein said substrate includes a metallic sheet electrically connected with the first ends of said leads.

66. The method as claimed in claim 65, wherein said metallic sheet includes copper.

67. The method as claimed in claim 65, further comprising removing portions of said metallic sheet so as to leave residual portions of said metallic sheet forming first conductive terminals electrically connected to the first ends of said leads.

68. The method as claimed in claim 67, wherein the step of removing portions of said metallic sheet follows the moving step.

69. The method as claimed in claim 67, wherein the step of removing portions of said metallic sheet precedes the moving step.

70. The method as claimed in claim 69, further comprising forming vias in said dielectric layer extending toward said removable layer so as to expose the second ends of said leads.

71. The method as claimed in claim 67, wherein the step of removing portions of said metallic sheet includes etching said metallic sheet.

72. The method as claimed in claim 71, wherein the etching step includes depositing spots of an etch-resistant material on said metallic sheet and then exposing the metallic sheet to an etching solution.

73. The method as claimed in claim 67, further comprising:
providing a microelectronic element having contacts thereon; and
electrically connecting the first conductive terminals with the contacts of said microelectronic element.

74. The method as claimed in claim 73, wherein said microelectronic element is selected from a the group consisting of a circuit board, a wafer, a flexible circuit, a dielectric layer, a test socket, a packaged semiconductor chip, and one or more bare semiconductor chips.

75. The method as claimed in claim 73, further comprising forming vias in said dielectric layer extending toward said removable layer so as to expose the second ends of said leads.

76. A method of making a component having one or more leads comprising:
(a) providing a removable layer having first and second surfaces;
(b) depositing a conductive material over the first surface of said removable layer so as to form said one or more leads, wherein each said lead includes a first end and a second end at a location remote from the first end of said lead;
(c) providing a microelectronic element having a contact bearing face and connecting the second ends of said leads to the microelectronic element; and
(d) removing said removable layer.

77. The method as claimed in claim 76, further comprising:
providing a second microelectronic element having a contact bearing face; and
connecting the first ends of said leads to the contact bearing face of the second microelectronic element.

78. The method as claimed in claim 77, further comprising, after removing the removable layer and after the first and second ends of the leads have been connected with the first and second microelectronic elements, moving said first and second microelectronic elements away from one another with component of motion in a generally vertical direction for deforming said leads to a vertically-extensive disposition.

79. The method as claimed in claim 78, further comprising encapsulating the leads with a first encapsulant.

80. The method as claimed in claim 79, further comprising disposing a second encapsulant between the first and second microelectronic elements.

81. The method as claimed in claim 80, wherein the steps of encapsulating the leads with a first encapsulant and disposing a second encapsulant between the first and second microelectronic elements occur simultaneously.

82. The method as claimed in claim 80, wherein the first and second encapsulants comprise a common material.

* * * * *

UNITED STATES PATENT AND TRADEMARK OFFICE
CERTIFICATE OF CORRECTION

PATENT NO.     : 6,461,892 B2  
DATED          : October 8, 2002  
INVENTOR(S)    : Masud Beroz Page 1 of 1

It is certified that error appears in the above-identified patent and that said Letters Patent is hereby corrected as shown below:

<u>Column 21,</u>
Line 54, "22" should read -- 27 --.

<u>Column 23,</u>
Line 21, "12" should read -- 42 --.
Line 63, "69" should read -- 67 --.

<u>Column 24,</u>
Line 16, delete "the".

Signed and Sealed this

Fifteenth Day of April, 2003

JAMES E. ROGAN
*Director of the United States Patent and Trademark Office*